United States Patent [19]
Hatanaka et al.

[11] Patent Number: 6,069,393
[45] Date of Patent: May 30, 2000

[54] PHOTOELECTRIC CONVERTER

[75] Inventors: Katsunori Hatanaka, Yokohama; Toshihiro Saika; Takayuki Ishii, both of Hiratsuka; Katsuhiko Yamada; Satoshi Itabashi, both of Atsugi; Kazuaki Tashiro, Yokohama; Tetsuya Shimada, Zama, all of Japan

[73] Assignee: Canon Kabushiki Kaisha, Tokyo, Japan

[21] Appl. No.: 08/468,518

[22] Filed: Jun. 6, 1995

Related U.S. Application Data

[63] Continuation-in-part of application No. 08/144,509, Nov. 2, 1993, abandoned, which is a continuation of application No. 08/001,404, Jan. 7, 1993, abandoned, which is a continuation of application No. 07/758,516, Sep. 6, 1991, abandoned, which is a continuation of application No. 07/617,938, Nov. 26, 1990, abandoned, which is a continuation of application No. 07/208,223, Jun. 17, 1988, abandoned.

[30] Foreign Application Priority Data

| Jun. 26, 1987 | [JP] | Japan | 62-160505 |
|---|---|---|---|
| Jun. 26, 1987 | [JP] | Japan | 62-160509 |
| Jun. 26, 1987 | [JP] | Japan | 62-160511 |
| Jun. 26, 1987 | [JP] | Japan | 62-160512 |
| Jun. 26, 1987 | [JP] | Japan | 62-160513 |

[51] Int. Cl.$^7$ .................. H01L 31/0203; H01L 31/00
[52] U.S. Cl. ..................... 257/434; 257/435; 257/443
[58] Field of Search ............ 357/30 R, 30 G, 357/30 H, 30 Q, 51, 31, 23.6; 257/434, 435, 443

[56] References Cited

U.S. PATENT DOCUMENTS

| 3,811,076 | 5/1974 | Smith, Jr. ............ 317/235 R |
|---|---|---|
| 3,841,926 | 10/1974 | Garnache et al. ............ 148/188 |
| 4,035,829 | 7/1977 | Ipri et al. ............ 357/49 |
| 4,291,337 | 9/1981 | Takamura et al. ............ 358/213 |
| 4,349,743 | 9/1982 | Ohba et al. ............ 250/578 |
| 4,480,009 | 10/1984 | Berger ............ 428/447 |
| 4,577,232 | 3/1986 | Hynecek ............ 358/213 |
| 4,591,916 | 5/1986 | Soneda et al. ............ 358/213 |
| 4,609,935 | 9/1986 | Kondo ............ 357/51 |
| 4,650,984 | 3/1987 | Furushima et al. ............ 250/211 |
| 4,679,088 | 7/1987 | Chiyoma et al. ............ 358/213.18 |
| 4,691,244 | 9/1987 | Cannella et al. ............ 358/294 |
| 4,742,239 | 5/1988 | Nakagawa et al. ............ 250/518 |

FOREIGN PATENT DOCUMENTS

| 0079775 | 5/1983 | European Pat. Off. . |
|---|---|---|
| 3500645 | 7/1985 | Germany . |
| 60-178663 | 9/1985 | Japan . |
| 61-32571 | 2/1986 | Japan . |

OTHER PUBLICATIONS

"Advances in Deposition Processes for Passivation Films", W.Kern & R.Rosler Journal of Vacuum Science & Tech., vol. 14, #5, Sep./Oct. 1977, pp. 1082–1099.

"Reduction of Capacitive Coupling Between Adjacent Dielectrically Supported Conductors", IBM Tech. Disclosure Bulletin; vol. 21, No. 12, May 1979.

*Primary Examiner*—Stephen D. Meier
*Attorney, Agent, or Firm*—Fitzpatrick Cella Harper & Scinto

[57] ABSTRACT

An image sensor includes a photoelectric conversion unit, a charge storage unit, a switch unit, and a wiring unit, all of which are formed on a single substrate. A capacitor of the charge storage unit is formed at the same substrate position as that of a pattern of said wiring unit.

21 Claims, 22 Drawing Sheets

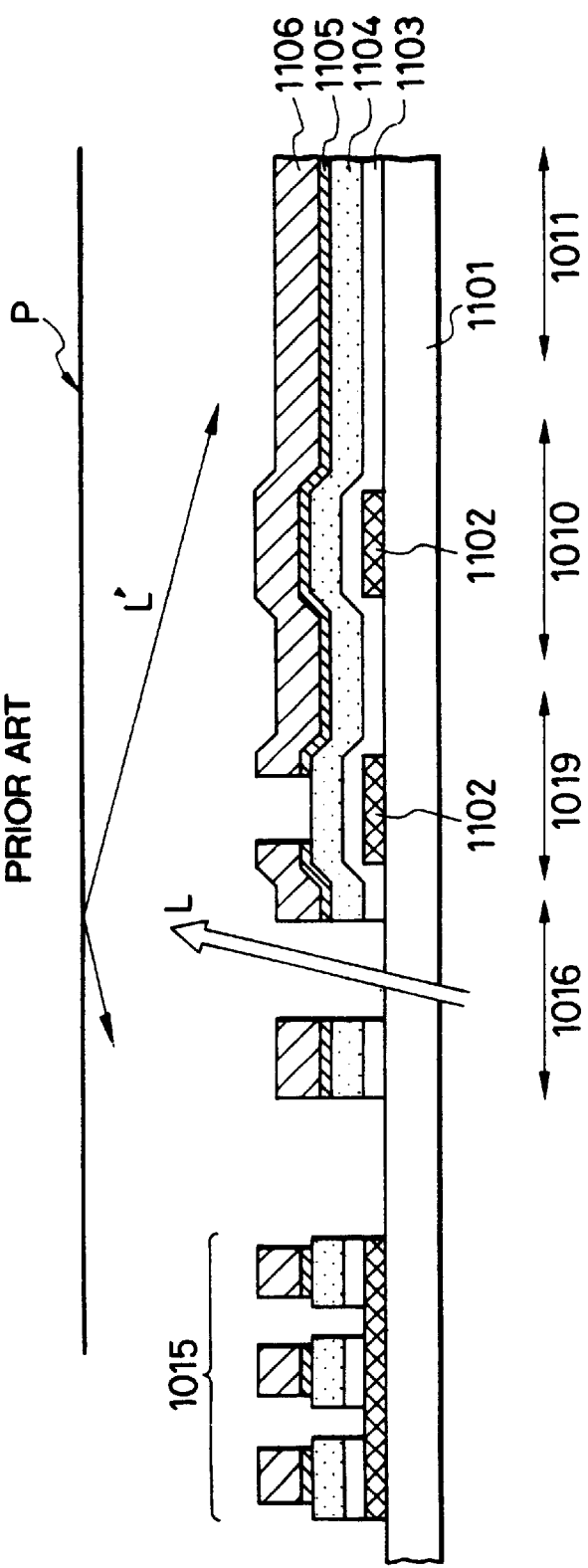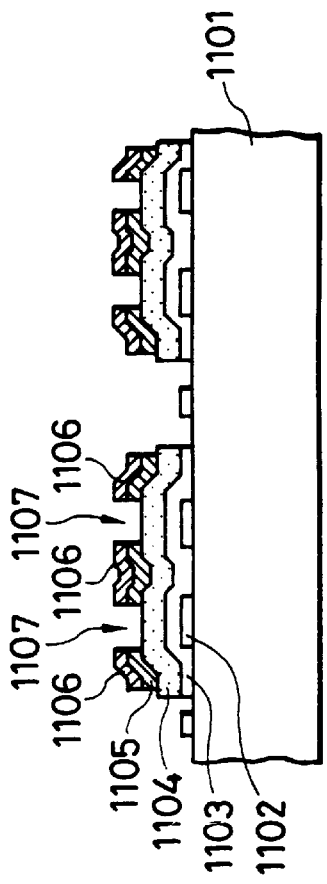

PHOTOELECTRIC CONVERTER

This application is a continuation of application Ser. No. 08/144,509, filed Nov. 2, 1993, now abandoned, which is a continuation of application Ser. No. 08/001,404, filed Jan. 7, 1993, now abandoned, which is a continuation of application Ser. No. 07/758,516, filed Sep. 6, 1991, now abandoned, which is a continuation of application Ser. No. 07/617,938, filed Nov. 26, 1990, now abandoned, which is a continuation of application Ser. No. 07/208,223, filed Jun. 17, 1988, now abandoned.

BACKGROUND OF THE INVENTION

1. Field of the Invention

The present invention relates to a photoelectric converter and more particularly, to a photoelectric converter used as an input unit of a facsimile system, an image reader, a digital copying machine, an electronic blackboard or the like.

2. Related Background Art

In recent years, an elongated line sensor including an optical system having a 1:1 magnification has been developed as a photoelectric converter for a compact, high-performance system such as a facsimile system and an image reader. However, various problems are presented in the development of a compact, high-performance system as follows.

A typical photoelectric converter is exemplified by an image sensor represented by a contact type line sensor used in a facsimile system, an image scanner or the like. The contact type line sensor includes a reading unit having the same size as that of a width of an original. A conventional image sensor of this type is manufactured or formed using a photoconductive material such as hydrogenated amorphous silicon (to be referred to as a-Si:H hereinafter), CdS, and CdSe on an elongated substrate consisting of glass or the like according to a thin-film deposition technique such as deposition.

The assignee of the present applicant proposed a photoelectric converter in Japanese Patent Application No. 61-144990. In this photoelectric converter, thin-film transistors (to be referred to as TFTs hereinafter) of a-Si:H or poly-Si, TFT sensor elements, storage capacitors, and the like are formed on a single substrate.

FIG. 1 shows an equivalent circuit diagram of a matrix driven image sensor.

The image sensor includes TFT sensors $S_1$ to $S_{n \cdot m}$ storage capacitors $C_{s1}$ to $C_{sn \cdot m}$ for storing photocurrents from the sensors $S_1$ to $S_{n \cdot m}$ switches (TFT) $U_1$ to $U_{n \cdot m}$ for resetting the charges of the storage capacitors $C_{s1}$ to $S_{sn \cdot m}$ and switches (TFT) $T_1$ to $T_{n \cdot m}$ for reading out the charges from the storage capacitors $C_{s1}$ to $C_{sn \cdot m}$ and transferring them to readout capacitors $C_{L1}$ to $C_{Ln}$. The reset and transfer TFTs are blocked in an n×m matrix. The image sensor also includes a shift register/driver 11 for sequentially selecting and driving gate lines (1 to m+1) and a switch array 12 for reading voltages of signal lines (1 to n) and serially converting and outputting the read voltages.

FIG. 2 shows a one-bit wiring pattern of the image sensor of the equivalent circuit diagram shown in FIG. 1. The one-bit wiring pattern includes a signal line matrix unit 13, a sensor 14, a contact hole 15, a storage capacitor 16, a transfer TFT 17, a reset TFT 18, a gate wiring unit 19, and an illumination window 20. In this arrangement, light passing through window 20 from below is reflected by an original and received by the sensor, thus constituting a "lensless" type arrangement.

FIG. 3 is a sectional view of the pattern of FIG. 2 along the line X–X' of FIG. 2, FIG. 4 is a sectional view thereof along the line Y-Y' of FIG. 2. The pattern in FIG. 3 comprises a glass substrate 1, a lower electrode 21, an insulating layer 3, an a-Si:H layer 4, an $n^+$-type doped layer 5, and an upper electrode layer 22. Similarly, the pattern in FIG. 4 comprises a glass substrate 1, lower electrodes 21, an insulating layer 3, an a-Si:H layer 4, an $n^+$-type doped layer 5, and upper electrode layers 22 and 23.

In the conventional patterns, since the TFT sensor is used, photosensitivity is as large as 10 to 100 times that of a photodiode type sensor. In addition, the above pattern has advantages in a high light transmission rate and high illumination on the sensor surface.

However, since a sensor photocurrent is large, a large storage capacitance corresponding to the sensor photocurrent is required. Although the large storage capacitance is advantageous from the viewpoint of characteristics such as an S/N ratio and the dynamic range, the large storage capacitance is not necessarily advantageous from the viewpoint of manufacturing cost. More specifically, when the storage capacitance is increased, the substrate size is increased by an area corresponding to an increased capacitance component. Therefore, the number of sensors per batch is undesirably decreased.

In the elongated line sensor including the optical system having a 1:1 magnification, signal processing ICs (Integrated Circuits) constituted by switching elements or the like are connected to an array of photoelectric conversion elements. However, the number of photoelectric conversion elements is 1728 in an A4 size when the photoelectric converter complies with the facsimile G3 standard. A large number of signal processing ICs are thus required. For this reason, the number of mounting steps is increased, the manufacturing cost is increased, and sensor reliability is degraded. Matrix wiring is employed to reduce the number of signal processing ICs and the number of mounting steps.

FIG. 5 is a block diagram of a photoelectric converter employing matrix wiring. Referring to FIG. 5, the photoelectric converter includes a photoelectric conversion unit 201, a scanning unit 201, a signal processing unit 203, and a matrix wiring unit 204. FIG. 6 is a plan view of the conventional matrix wiring unit, and FIGS. 7A and 7B are sectional views of the matrix wiring unit of FIG. 6 along the lines A-A' and B-B', respectively.

Referring to FIGS. 7A and 7B, the matrix wiring unit includes a substrate 301, separate electrodes 302 to 305, an insulating layer 306, common lines 307 to 309, and a through hole 310 for bringing the separate electrode into ohmic contact with the corresponding common line.

In the photoelectric converter employing matrix wiring, the number of signal processing circuits in the signal processing unit 203 is equal to that of output lines of the matrix. Therefore, the signal processing unit can be advantageously made compact and the photoelectric converter becomes inexpensive.

In the photoelectric converter using a thin-film semiconductor, sensor elements and TFTs constituting a transfer circuit are simultaneously formed on a single substrate, thus providing a compact, low-cost photoelectric converter. In addition, still another conventional photoelectric converter is also proposed wherein photoelectric conversion elements detect, through a transparent spacer of glass or the like, light reflected by an original. A 1:1 magnification fiber lens array is not used in this arrangement.

FIG. 8 shows a illustrative sectional view of such a photoelectric converter. At a mount base 175, a light incident window 178 is provided. A light from a light source 174 shines through the light incident window 178. On the mount base 175, a photoelectric converter 173 having photoelectric conversion elements (not shown) is disposed adjacent a thin transparent spacer 177 which is adjacent to the original. IC176 is provided for processing a light signal from the photoelectric conversion device 173. The light passing through the incident light window illuminates, via the photoelectric conversion device 173, the original 178 fed by a paper feed roller 171. A light reflected from the original is read by the photoelectric conversion elements on the device 173.

The photoelectric converter using the conventional matrix wiring has the following problems.

Since a very low output of each photoelectric conversion element is read out the through matrix wiring, crosstalk occurs between output signals unless a stray capacitance at an insulated (overlapping, non-contact) intersections between the separate output electrode of each photoelectric conversion element and the corresponding common line of the matrix is sufficiently decreased (see the non-contact wiring intersections in gate wiring unit 19 in FIG. 2). This condition imposes strict limitations to the selection of an insulating interlayer material and dimensional design of the matrix.

Each matrix common line extends in the longitudinal direction of the photoelectric converter and undesirably has a length of, e.g., 210 mm in a line sensor having a length corresponding to an A4 width. For this reason, when a capacitance between the common lines is not sufficiently decreased, crosstalk occurs between the output signals. This disadvantage results in a large matrix unit.

The pitch of the separate output electrodes of the photoelectric conversion elements is as small as, e.g., 125 $\mu$m in a photoelectric converter having a resolution of 8 lines/mm. For this reason, crosstalk occurs between the output signals unless the capacitance between the separate electrodes is sufficiently decreased.

SUMMARY OF THE INVENTION

It is an object of the present invention to provide a compact, high-performance photoelectric converter capable of solving the conventional problems described above, such as crosstalk on the signal lines.

According to an aspect of the present invention, there is provided an image sensor comprising a photoelectric conversion unit, a charge storage unit, a switch unit, and a wiring unit, all of which are formed on a single substrate, wherein capacitors of the charge storage unit are formed at the same substrate positions as a wiring unit pattern. Therefore, the number of insulating layers and the number of wiring layers can be increased to form the storage capacitors at the same substrate position as the wiring unit. Even if a sensor photocurrent and the capacitance are increased, the width of the sensor substrate can be reduced, thus solving the conventional problems described above.

It is another object of the present invention to provide a photoelectric converter comprising a compact matrix wiring unit free from crosstalk between output signals in the photoelectric converter, wherein the performance is not degraded even if the converter is made compact.

In order to achieve this object according to an aspect of the present invention, there is provided a photoelectric converter including a plurality of one-dimensionally arranged photoelectric conversion elements, a plurality of thin-film transistors respectively connected to the photoelectric conversion elements, and a plurality of common lines each for commonly connecting at least two of the output lines from the plurality of thin-film transistors, comprising: a conductive layer formed at intersections between the separate output electrodes and the common lines so as to maintain a potential at a predetermined level; and a wiring pattern formed between the separate electrodes and between the common lines so as to maintain a potential at a predetermined level, wherein the photoelectric conversion elements and the plurality of common lines are formed on a single substrate.

The conductive layer is formed at the intersections between the separate output electrodes of the photoelectric conversion elements and the common lines so as to maintain the potential at the predetermined level, so that stray capacitances at the insulated intersections between the separate electrodes and the common lines can be eliminated. In addition, the wiring pattern is formed between the separate electrodes and between the common lines to maintain the potential at the predetermined level, so that capacitances between the electrodes and between the lines can be eliminated.

In order to achieve the second object according to another aspect of the present invention, there is provided a photoelectric converter comprising a plurality of one-dimensionally arranged photoelectric conversion elements, a plurality of common lines each for commonly connecting at least two of the separate output electrodes of the photoelectric conversion elements, a conductive layer formed at intersections between the separate output electrodes and the common lines so as to maintain a potential at a predetermined level, and a wiring pattern formed between the separate electrodes and between the common lines so as to maintain a potential at a predetermined level, wherein the photoelectric conversion elements and the plurality of common lines are formed on a single substrate and the potentials are sufficiently higher than a maximum potential of the output lines.

The conductive layer is formed at the intersections between the separate output electrodes of the photoelectric conversion elements and the common lines so as to maintain the potential at the predetermined level, so that stray capacitances at the insulated intersections between the separate electrodes and the common lines can be eliminated. In addition, the wiring pattern is formed between the separate electrodes and between the common lines to maintain the potential at the predetermined level, so that capacitances between the electrodes and between the lines can be eliminated.

In addition, in a photoelectric converter including TFTs and sensors, both of which are formed on a single substrate, or in a photoelectric converter excluding a 1:1 magnification fiber lens array, light reflected by an original is incident on the TFT unit in addition to the sensor elements, and current leakage occurs in the OFF state of the TFTs. For this reason, an output from the photoelectric converter becomes unstable, resulting in practical inconvenience.

It is still another object of the present invention to provide a photoelectric converter capable of eliminating the conventional drawbacks described above and comprising a compact matrix wiring unit free from crosstalk between output signals, and TFTs stably operated and free from current leakage. In order to achieve this object of the present invention, there is provided a photoelectric converter including a plurality of one-dimensionally arranged photoelectric conversion elements, a plurality of thin-film transistors respectively connected to the photoelectric conversion elements, and a plurality of common lines each for commonly connecting at least two of output lines of the plurality of thin-film transistors, comprising: a conductive layer formed at intersections between the separated output electrodes and the common lines so as to maintain a potential at a predetermined level; and a light-shielding layer formed on the thin-film transistors so as to oppose an original, the light-shielding layer being located at a position nearer to the original with respect to at least channel regions. Therefore, the conductive layer is formed at the intersections between the separate output electrodes of the photoelectric conversion elements and the common lines so as to maintain the potential at the predetermined level, so that stray capacitances at the insulated intersections between the separate electrodes and the common lines can be eliminated. In addition, the light-shielding layer is formed in the channel regions of the thin-film transistors, so that an increase in current leakage can be prevented.

It is still another object of the present invention to provide a photoelectric converter including a photoelectric conversion unit, a charge storage unit, a switch unit, and a wiring unit, all of which are formed on a single substrate, thereby solving the various operational problems. A typical arrangement of this photoelectric converter is shown in FIGS. 9 and 10A and 10B. Referring to FIGS. 9 and 10A, the photoelectric converter includes a capacitor unit 1010, a TFT unit 1011, and a matrix unit 1012. Referring to FIGS. 10A and 10B, the photoelectric converter includes a glass substrate 1109, a first conductive layer 1102, an a-Si:N layer 1103, an a-Si:H layer 1104, an n$^+$-type a-Si:H doping layer, a second conductive layer 1106, and channels 1107. Referring to FIG. 9, the photoelectric converter includes a photoelectric conversion element 1019, a light incident window 1016, a thin-film transistor (TFT) 1011, a capacitor 1010, and a matrix 1015.

As shown in FIG. 10A, scattered light L' is reflected from an original onto on the TFT formed near the photoelectric conversion element. A current leaks during the OFF state of the TFT and leads to a noise component, thereby decreasing an S/N ratio. In a conventional single-gate structure, only the regions near the interface between the first gate insulating film and the semiconductor layer of the TFT semiconductor layers are used, and utilization efficiency of the semiconductor layers is undesirably limited. No electrical control is provided to an interface between the semiconductor layer and the insulating layer at a position opposite to the gate. Therefore, this interface is electrically unstable, and current leakage tends to occur in this area.

In order to solve the above problem, there is provided an image reading apparatus including a plurality of photoelectric conversion elements using a thin-film semiconductor, a peripheral circuit of thin-film transistors, and a wiring matrix, all of which are formed on a single substrate, comprising: a conductive layer for maintaining a potential at a predetermined level at intersections between the separate output electrodes of the photoelectric conversion elements and the common lines, and a wiring pattern formed between the separate output electrodes and between the common lines so as to maintain a potential at a predetermined level, wherein the same material as that of the electrode layer of a first gate is used to form a second gate at a side opposing the first gate of the thin-film transistor.

With the above arrangement, the conductive layer is formed at the intersections between the output separate electrodes of the photoelectric conversion elements and the common lines to maintain the potential at a predetermined level, so that stray capacitances formed at the insulated intersections of the separate electrodes and the common lines can be eliminated. In addition, the wiring pattern is formed between the separate electrodes and the common lines so as to maintain a potential at a predetermined level, so that capacitances are not formed between the electrodes and between the lines. Furthermore, the second gate electrode of the TFT is formed by using the same material as that of the electrode metal of the first gate in a single process. Light reflected and scattered by the surface of the original is not incident on the channel regions of the TFTs. Since the same material and process as those of the matrix are used, a light-shielding means for the TFT need not be provided, and the fabrication process can be simplified, thus decreasing fabrication cost. In addition, the upper and lower gates are formed to vertically widen a depletion layer in the semiconductor thin film in the OFF state of the TFT, thereby preventing a flow of carriers. The carriers are then discharged from an interface with an insulating film having a large leakage current, and thus a large OFF resistance can be obtained. In the ON state, by utilizing the interfaces of the semiconductor layer and the insulating layer on the first and second gate sides, an ON current can be increased. As a result, an S/N ratio can be increased. In the above arrangement, the first gate is electrically connected to the second gate through the contact hole. In this case, the first and second gates are kept at the same potential. However, in another arrangement, the first and second gates may be connected to different wiring layers, and different voltages may be applied thereto, thereby electrically controlling the interface between the semiconductor and insulating layers.

BRIEF DESCRIPTION OF THE DRAWINGS

FIGS. 10A and 10B are sectional views of the photoelectric converter shown in FIG. 9 along the lines A-A' and B-B', respectively;

DETAILED DESCRIPTION OF THE PREFERRED EMBODIMENTS

Preferred embodiments of the present invention will be described in detail with reference to the accompanying drawings hereinafter.

Figure 1:
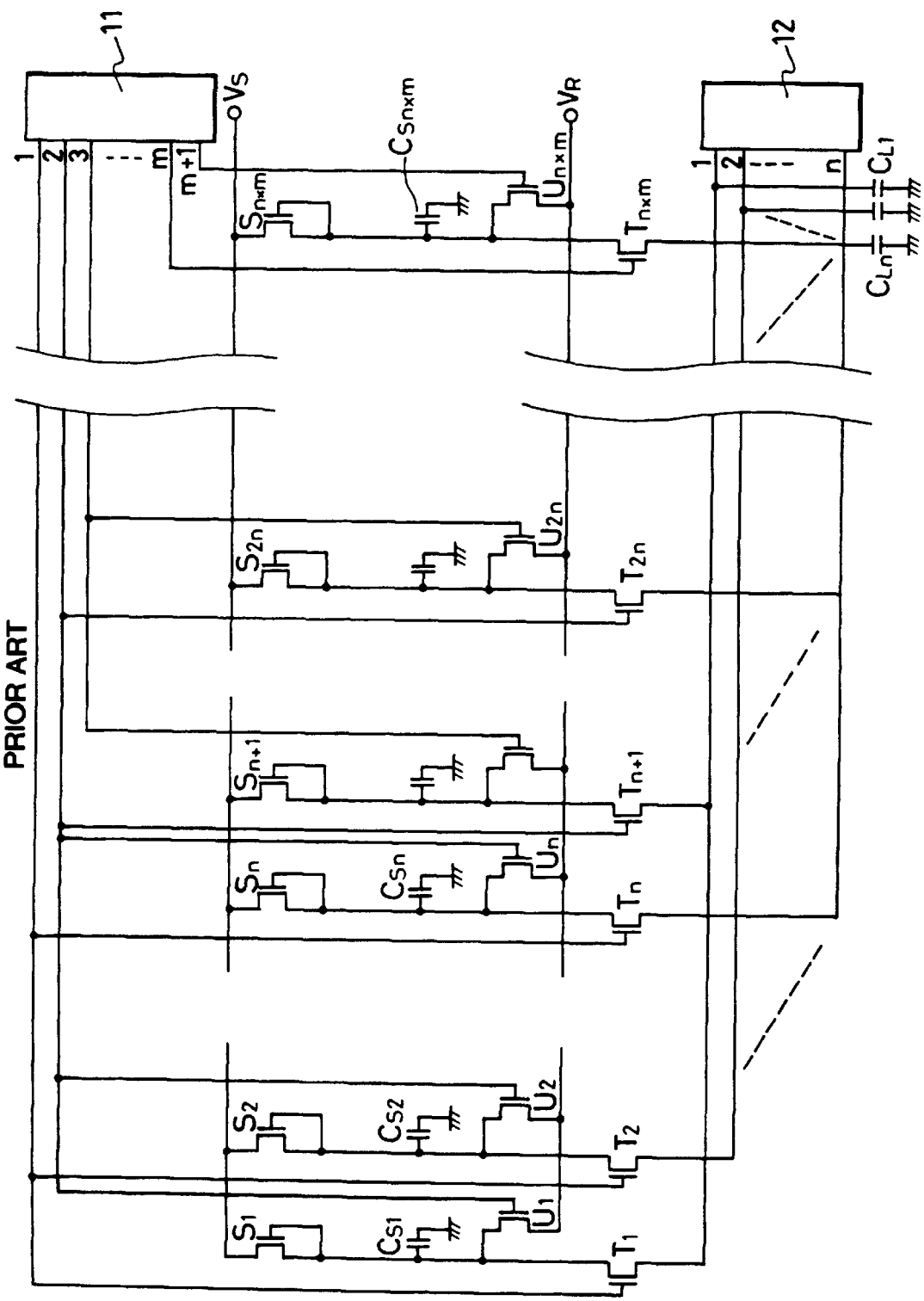
FIG. 1 is an equivalent circuit diagram of a conventional matrix type photoelectric converter.
Figure 2:
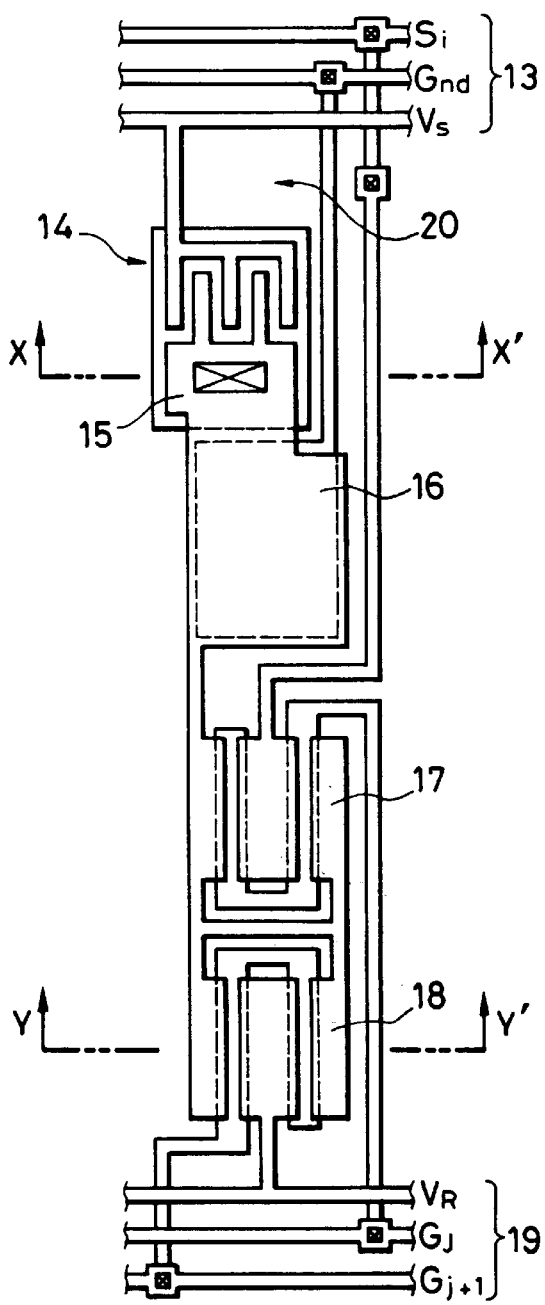
FIG. 2 is a plan view showing a conventional pattern.
Figure 3:
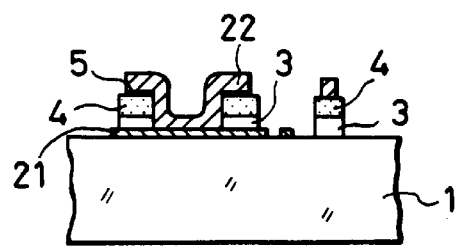
FIG. 3 is a sectional view of the pattern in FIG. 2 along the line X-X' thereof.
Figure 4:
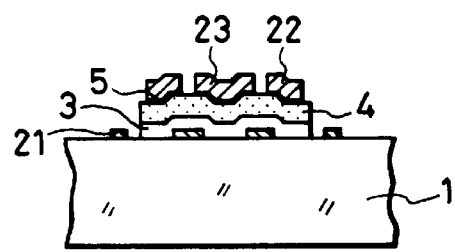
FIG. 4 is a sectional view of the pattern in FIG. 2 along the line Y-Y' thereof.
Figure 5:
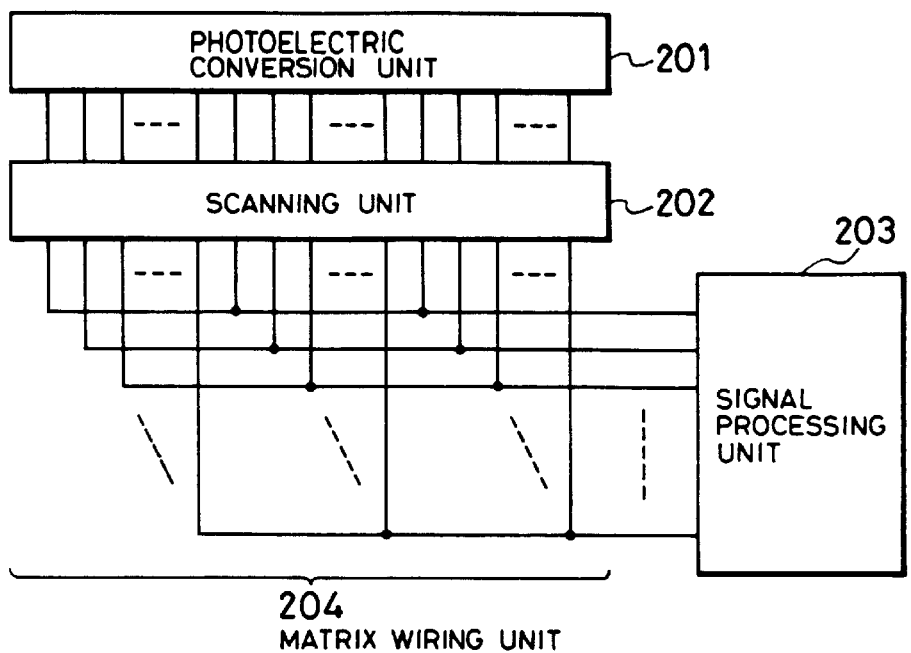
FIG. 5 is a block diagram showing a conventional image reading apparatus including a matrix wiring pattern.
Figure 6:
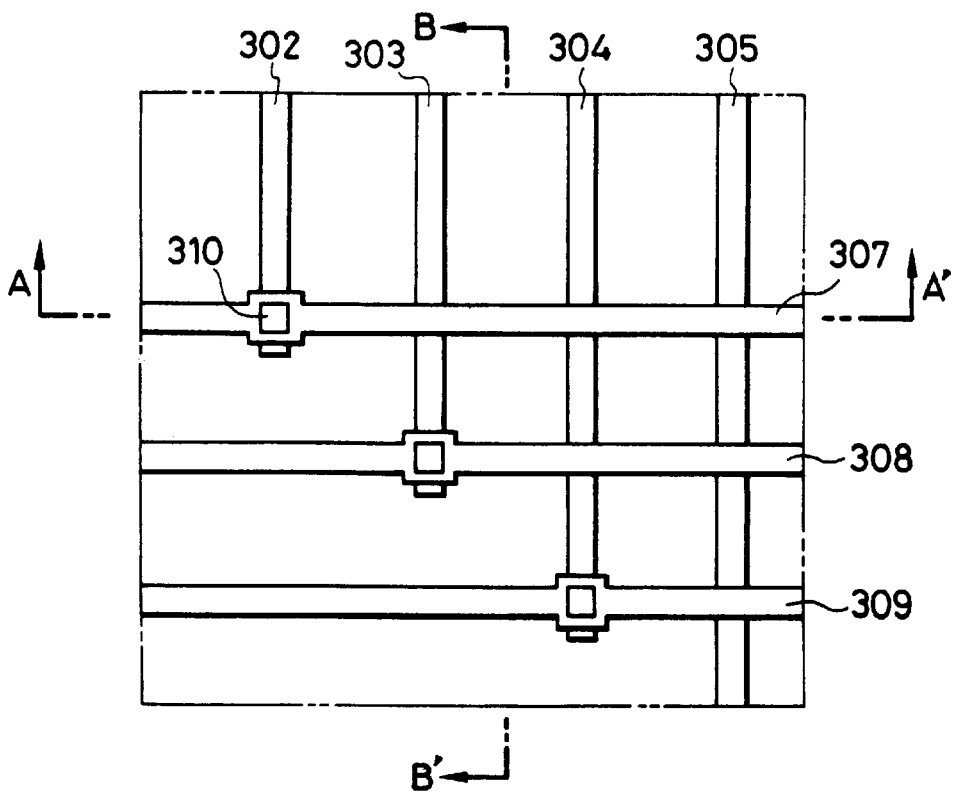
FIG. 6 is a sectional view showing a conventional matrix wiring unit.
Figure 7A:
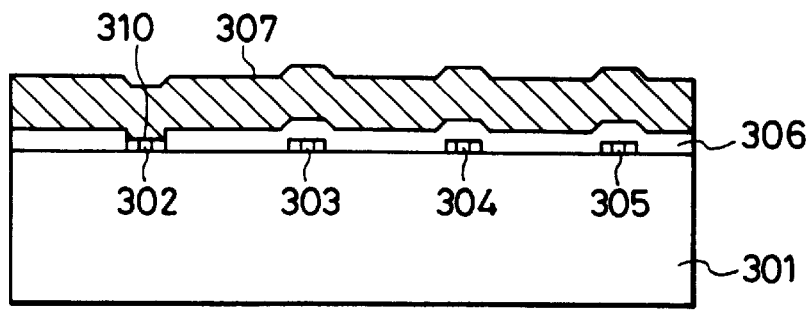
FIGS. 7A and 7B are sectional views of the matrix wiring unit shown in FIG. 6 along the lines A-A' and B-B' of FIG. 6, respectively.
Figure 7B:
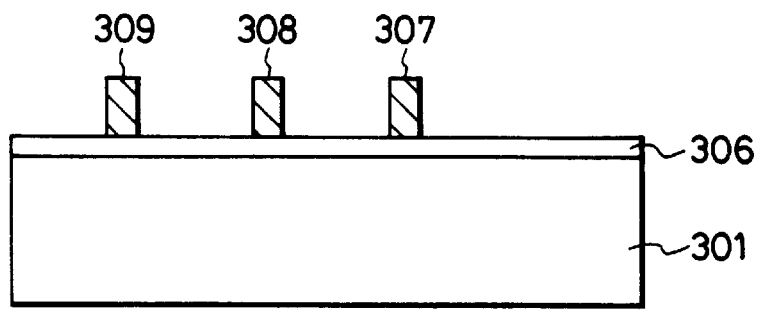
Figure 8:
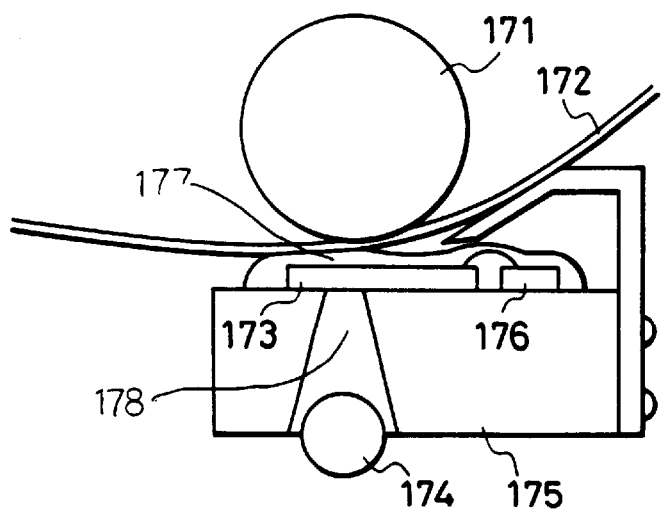
FIG. 8 is a sectional view showing a conventional image reading apparatus without using a fiber lens array having a 1:1 magnification.
Figure 9:
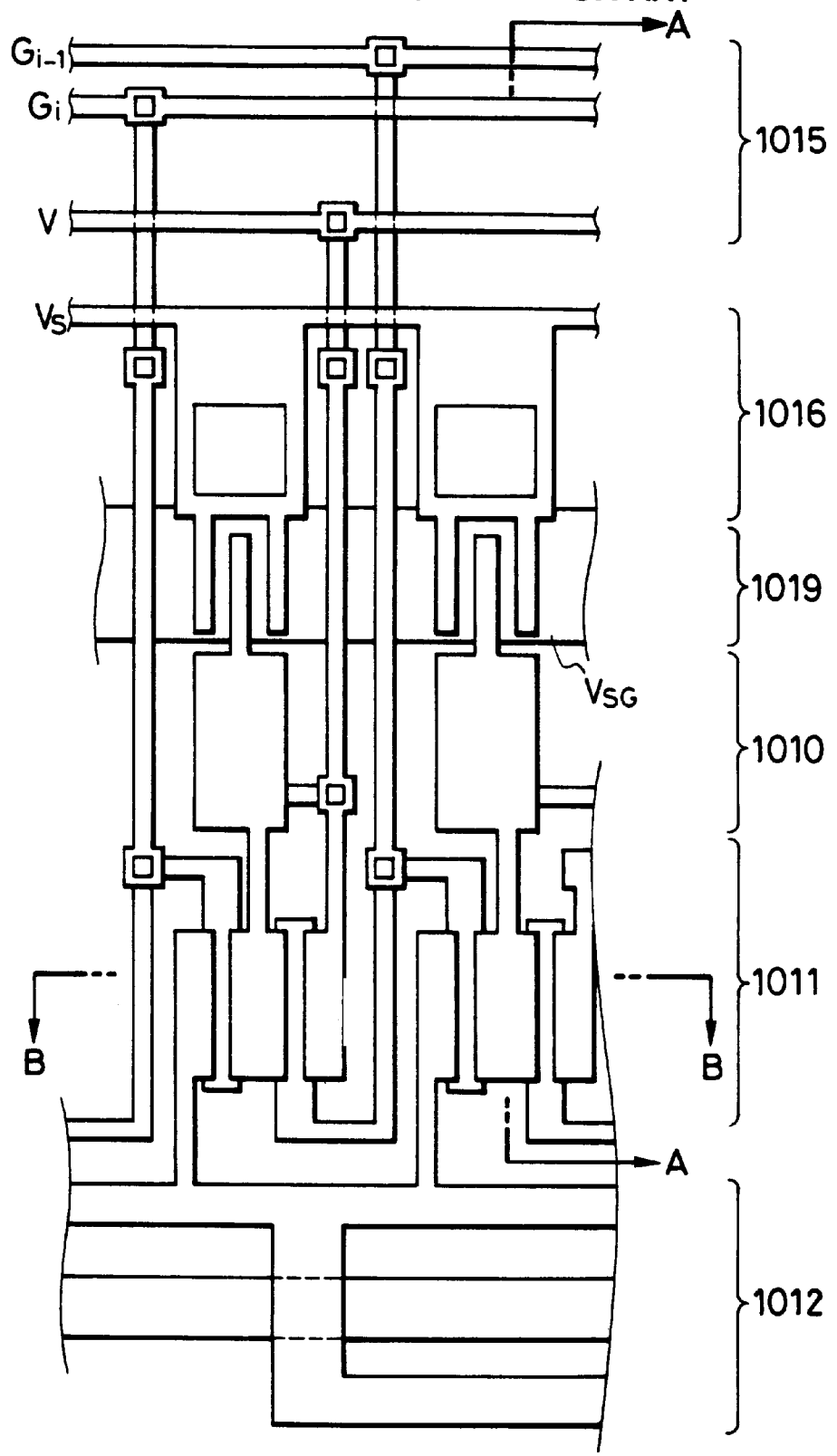
FIG. 9 is a plan view showing a conventional photoelectric converter including a photoelectric conversion element, a capacitor, and a wiring matrix TFT, all of which are formed on a single substrate.
Figure 11:
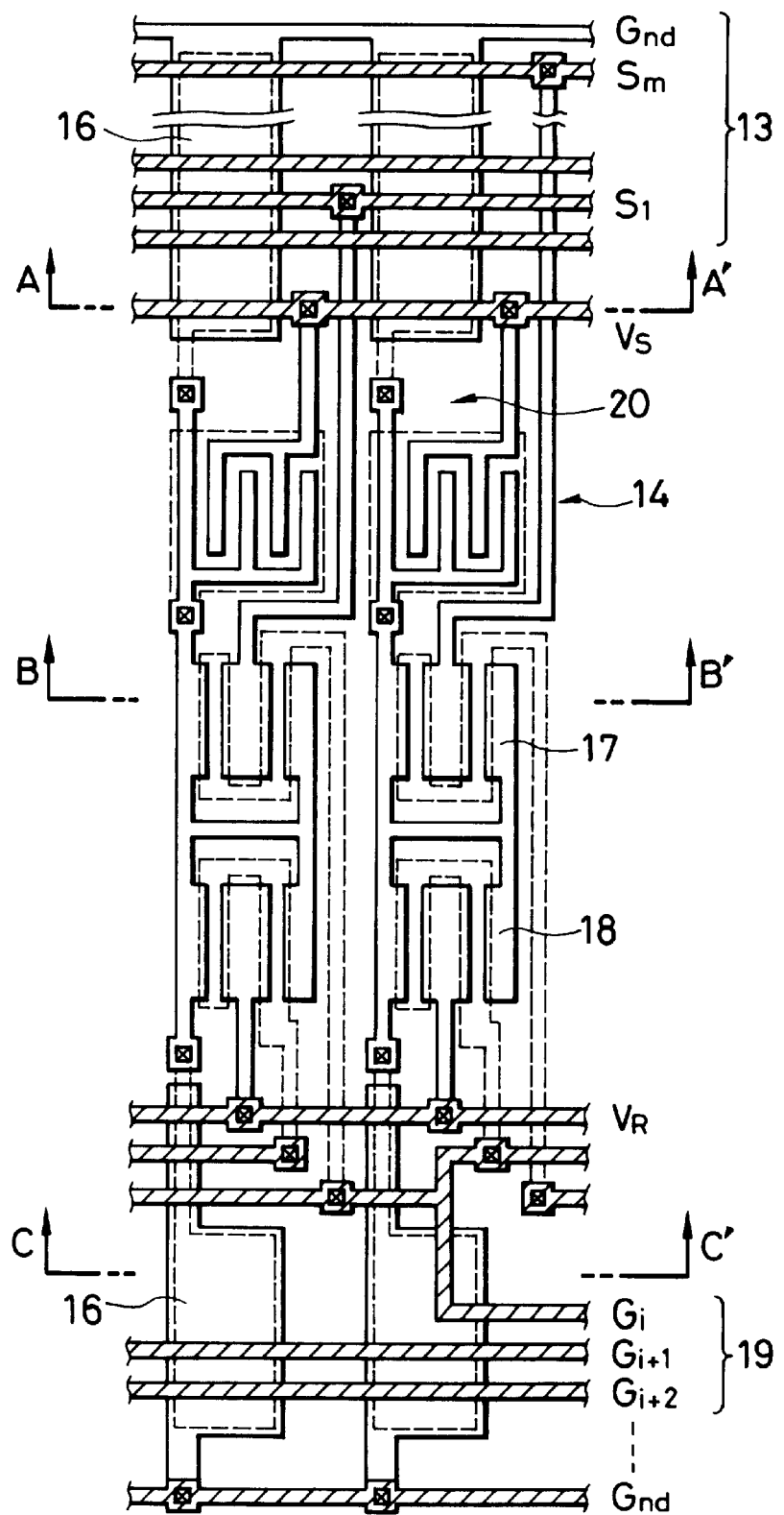
FIG. 11 is a plan view showing a pattern of a photoelectric converter according to an embodiment of the present invention.

FIG. 11 is a plan view showing a pattern of an image sensor according to an embodiment of the present invention. Dotted lines represent a wiring pattern of a first layer, solid lines represent a wiring pattern of a second layer, and hatched lines represent a wiring pattern of a third layer. The image sensor includes a signal line matrix unit 13, a sensor 14, storage capacitors 16 respectively formed in the signal line matrix unit 13 and a gate wiring unit 19, a transfer TFT 17, a reset TFT 18, and an illumination window 20.

Figure 12:
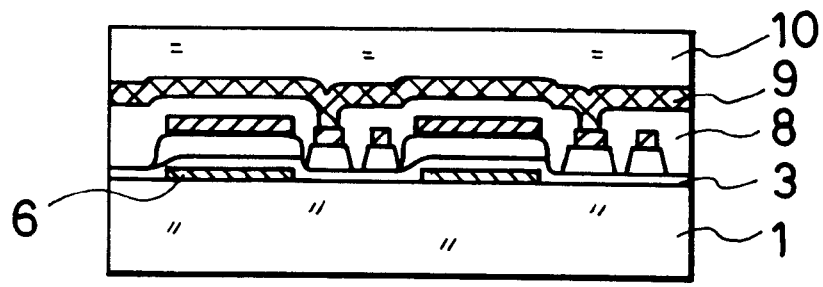
FIGS. 12, 13, and 14 are sectional views showing the pattern in FIG. 11 along the lines A-A', B-B', and C-C', respectively.
Figure 13:
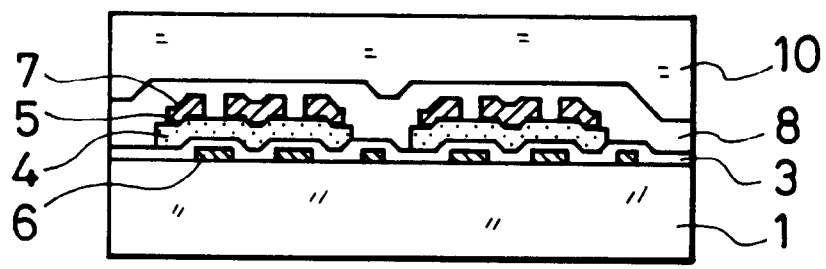
Figure 14:
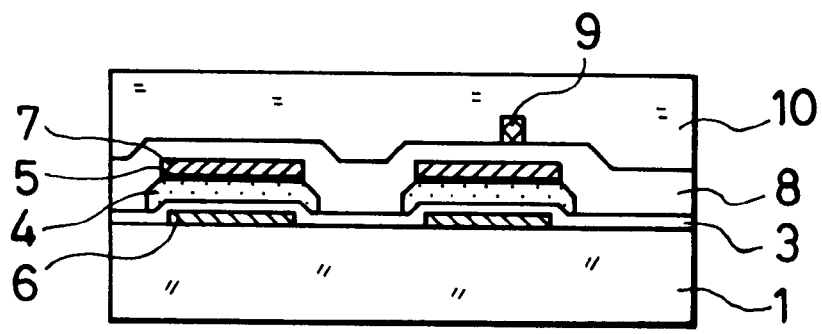

FIGS. 12, 13 and 14 are sectional views of the image sensor shown in FIG. 11 along the lines A-A', B-B', and C-C', respectively. Referring to FIGS. 12, 13, and 14, the image sensor includes a glass substrate 1, an insulating layer 3, an a-Si:H layer 4, an n$^+$-type a-Si:H doping layer 5, first layer electrodes 6 such as a gate electrode, a sensor gate electrode, and a storage capacitor electrode, second layer electrodes 7 such as source and drain electrodes of the TFT and a counter electrode of the capacitor, an insulating layer 8, third layer electrodes 9 extending in the longitudinal direction of the substrate, and a transparent protective layer 10.

If a pel density in the A4 read width is given as 8 pels/mm and 1728 pels are connected to a matrix pattern of 32×54 lines, 32 signal lines and 54 gate lines are required. If a process rule is given such that a line width is 20 µm and an interline space is 20 µm, a wiring width of the signal lines is (20 µm+20 µm)×32=1280 µm. Similarly, the wiring width of the gate lines is given as (20 µm+20 µm)×54=2160 µm. The wiring pattern required for matrix connections on the substrate has a width of about 3.4 mm along the longitudinal direction of the substrate.

Assuming that a sensor photocurrent is 40 nA, a storage time is 5 ms, and a storage saturation voltage is 5 V, a storage capacitance Cs is given as follows:

$$Cs = 40 \text{ nA} \times 5 \text{ ms}/5 \text{ V} = 40 \text{ pF}$$

When the storage capacitor is constituted by a MIS structure obtained by a gate insulating layer and an a-Si:H layer, as shown in FIG. 14, an area required for forming a 40-pF capacitor is about 3×10$^{-3}$ cm$^2$. When such a capacitor is designed in correspondence with a 125 µm pel pitch, the capacitor area becomes 100 µm×3 mm, which allows formation of a sufficient wiring pattern. By employing the construction of FIG. 11, the capacitor pattern area can be eliminated, and the substrate width can be decreased by about 3 mm. In particular, when a photoelectric sensor is driven by a matrix scheme, the pattern areas of the matrix wiring unit and the storage capacitor unit are more than a half of the entire area of the sensor substrate. Therefore, a decrease in substrate width according to the arrangement of the present invention can greatly increase a yield per fabrication batch, thus reducing fabrication cost.

In the arrangement of FIG. 11, an intermediate layer between side of the storage capacitor and the wiring pattern is kept at the ground potential, and the influence of signal crosstalk from the wiring unit can also be eliminated.

According to the above embodiment as described above, since the storage capacitors are formed at the same position as that of the wiring pattern, i.e., the storage capacitors and the wiring pattern overlap each other, the following effects are obtained:

(1) The width of the sensor substrate can be decreased to obtain a compact photoelectric converter.

(2) The number of converters per fabrication batch can be increased and their yield can also be increased.

(3) The cost of the photoelectric converter can be reduced.

(4) A capacitor having a sufficiently large capacitance can be formed, and therefore an S/N ratio can be increased and the dynamic range characteristics can be improved.

(5) The width of the sensor substrate can be reduced, and unnecessary wiring can be reduced, so that the resultant photoelectric converter can withstand external noise.

Figure 15:
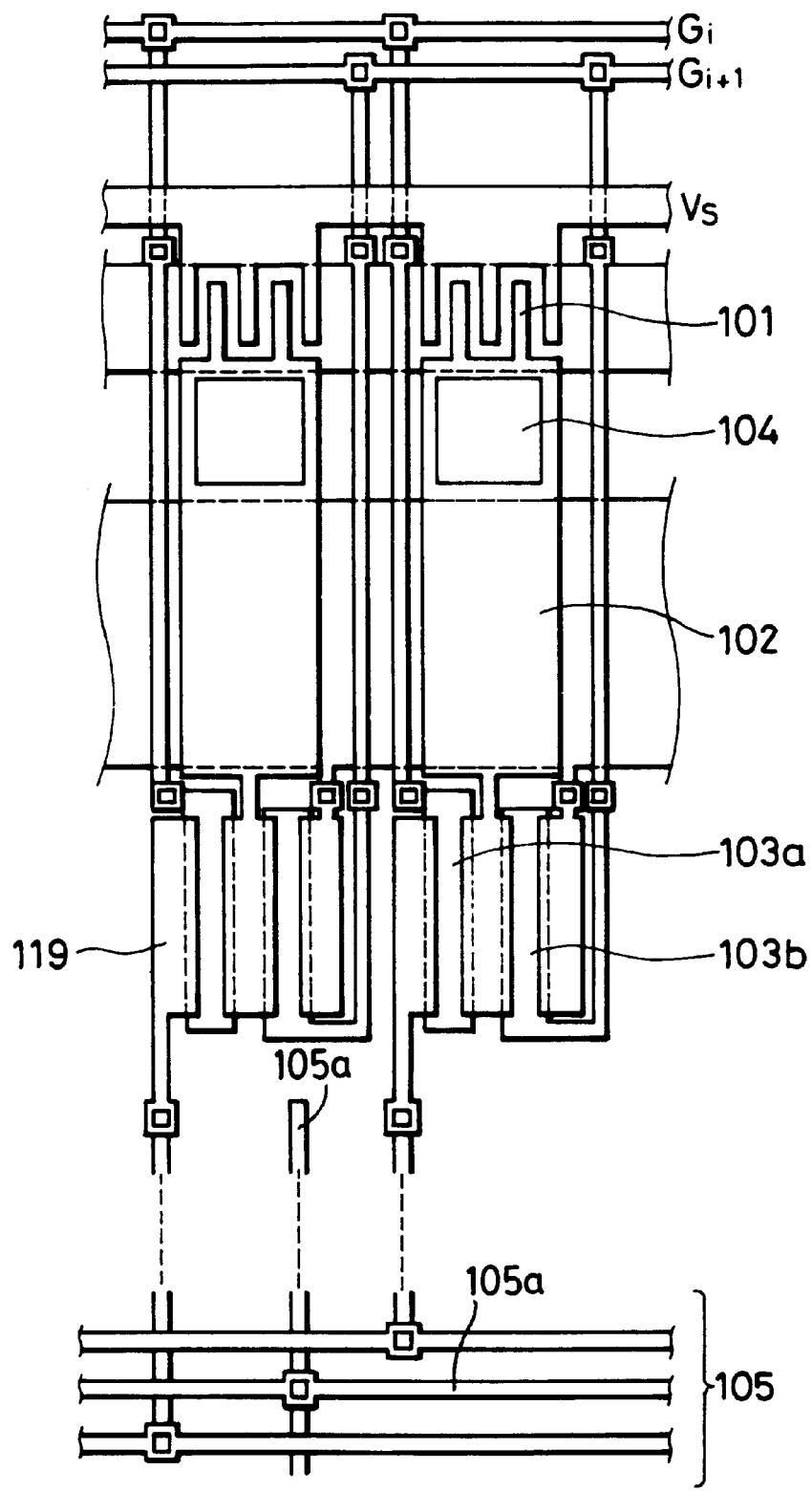
FIG. 15 is a plan view of a photoelectric converter according to another embodiment of the present invention.
Figure 16:
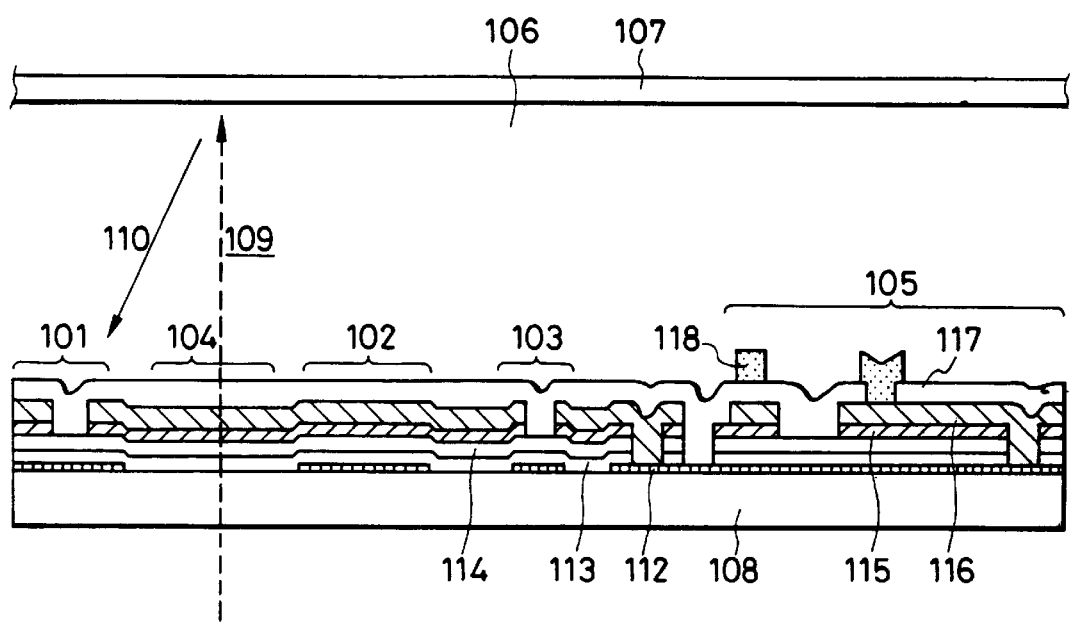
FIG. 16 is a sectional view of the photoelectric converter in FIG. 15.

FIG. 15 is a plan view of a photoelectric converter according to another embodiment of the present invention, FIG. 16 is a longitudinal view showing a cross section of the photoelectric converter shown in FIG. 15. The second conductive layer of the matrix unit in FIG. 15 is omitted. A light-shielding layer of the TFT is represented by the alternate long and short dashed line. In FIG. 15, 101 represents the photoelectric conversion unit, 104 is the light incident window, 102 is the capacitor, 103a, 103b and 119 represent the electrodes of the TFT unit, and 105 is the matrix unit. FIGS. 17A to 17F are sectional views for explaining the steps in manufacturing the photoelectric converter shown in FIG. 16.

Referring to FIG. 16, incident light 109 from a light source is incident on an original 107 through a transparent spacer 106 and is reflected by the original 107, and reflected light 110 is incident on a photoelectric conversion unit 101. The photoelectric converter also includes a substrate 108 and a matrix unit 105.

The steps in manufacturing the photoelectric converter shown in FIG. 16 will be sequentially described with reference to FIGS. 17A to 17F.

Figure 17A:
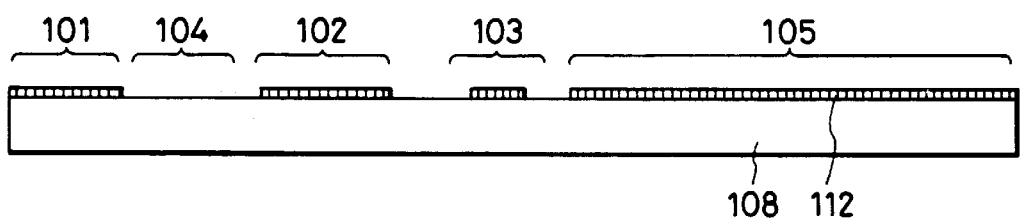
FIGS. 17A to 17F are sectional views for explaining the steps in manufacturing the photoelectric converter in FIG. 15.
Figure 17B:
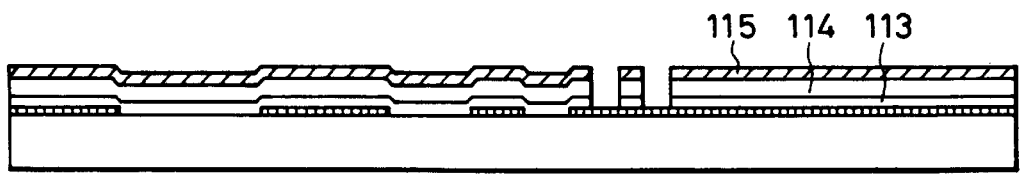
Figure 17C:
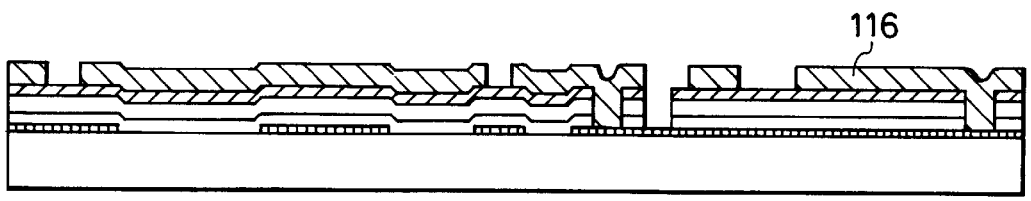
Figure 17D:
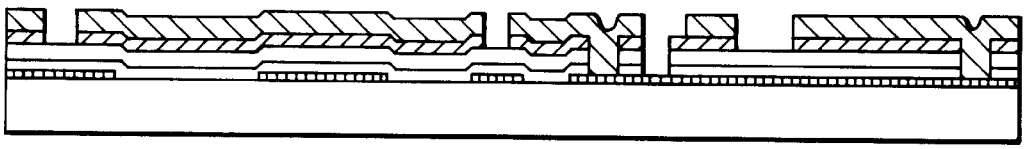
Figure 17E:
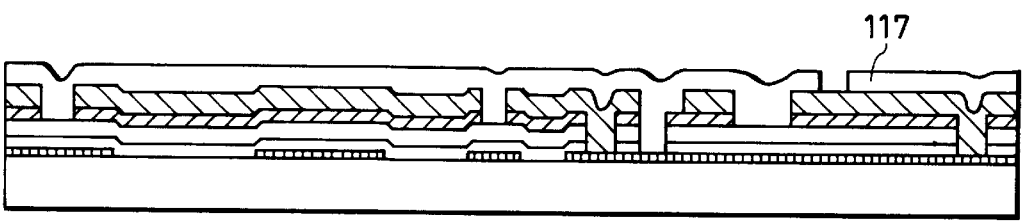
Figure 17F:
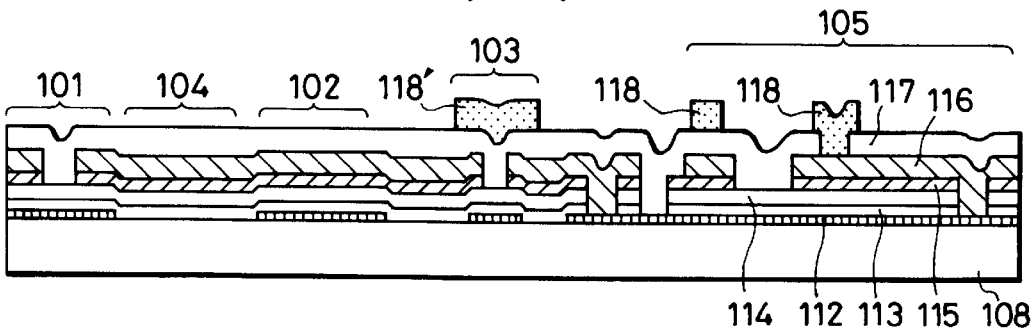

A first conductive layer 112 of Al, Cr, or the like is deposited on a glass tube transparent substrate 108 by sputtering, deposition, or the like and is patterned into a desired shape (FIG. 17A). An SiN layer 113 as a first insulating film known in plasma CVD, an a-Si:H layer 114, and an n$^+$-type a-Si:H doping layer 115 are formed and patterned into a desired shape (FIG. 17B). A second conductive layer 116 of Al, Cr, or the like is deposited by sputtering, deposition, or the like and patterned into a desired shape (FIG. 17C). Thereafter, the n$^+$-type doping layer of the channel region of TFT and the gap of the photoelectric conversion unit is removed by etching (FIG. 17D). A second insulating layer 117 of a polyimide or SiN film or the like is formed on the second conductive layer 116, and necessary contact holes are formed or desired patterning is performed as needed (FIG. 17E). Finally, a third conductive layer 118 of Al, Cr, or the like is formed on the second insulating layer 117 by sputtering or deposition and is patterned in a desired shape (FIG. 17F). Part 118' of the layer 118 is not formed in the structure shown in FIG. 16.

When the conductive layer is formed between the separate electrodes and the common lines so as to maintain the potential at a predetermined level, stray capacitances between the separate electrodes and the common lines can be eliminated. In addition, wiring patterns (stubs) 105a are formed between the separate electrodes and the common lines to maintain the potential at a predetermined level, so that interline capacitances are not formed between the separate electrodes and the common lines. Therefore, the lines are not capacitively coupled, and crosstalk between the output signals can be prevented.

According to the embodiment described above, there is provided a photoelectric converter free from crosstalk between the output signals and having a compact matrix wiring unit.

In the above structure, the conductive layer and the wiring pattern are kept at a potential sufficiently higher than the maximum potential of the output line. Therefore, the capacitance between the signal lines of a MIS structure and the conductive layer and the wiring pattern can be reduced.

Figure 18A:
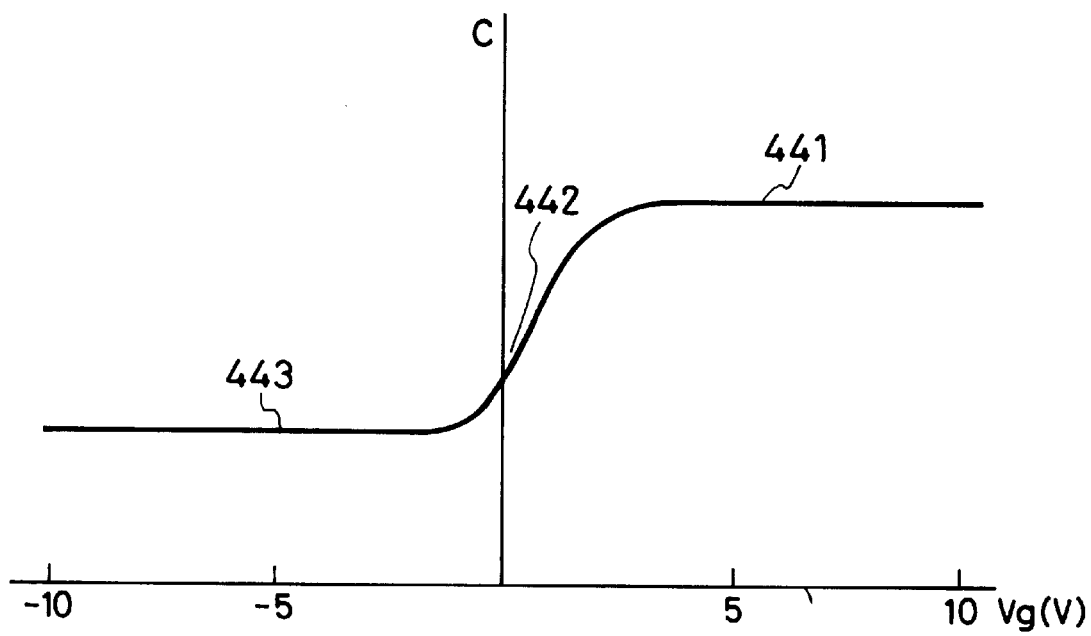
FIG. 18A is a graph showing C-V characteristics of a capacitor having a MIS structure shown in FIG. 15.
Figure 18B:
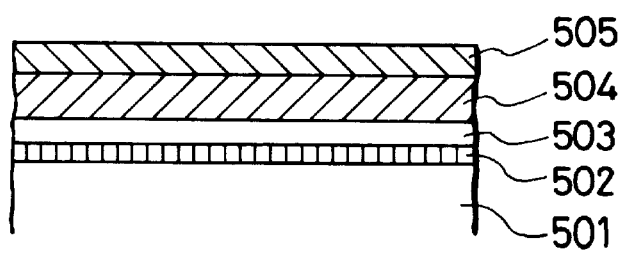
FIG. 18B is a sectional view showing the MIS structure shown in FIG. 18A.

FIG. 18A shows a C-V curve of the capacitor having a MIS structure as in the above embodiment. FIG. 18B shows a sectional view of a structure including the first conductive layer to the second conductive layer. The MIS structure consists of a substrate 501, a first conductive layer 502, an SiN first insulating layer 503, an a-Si:H semiconductor layer 504, and a second conductive layer 505. In this structure, an n$^+$-type a-Si:H doping layer is not illustrated.

As shown in FIG. 18A, when a gate (the first conductive layer 502) of the MIS capacitor is held at a negative potential, a depletion layer spreads in the semiconductor layer 504, and a capacitance is decreased (a region 442). When the depletion layer spreads to a full extent, the capacitance is kept at a small value (a region 443). In this case, when wiring is used, the capacitance between the first and second conductive layers is small. The first conductive layer 502 serves as signal lines. When the second conductive layer 505 is kept at a potential sufficiently higher than that of the signal lines, the portion between the conductive layers can be used as a region having a small constant capacitance.

Figure 19:
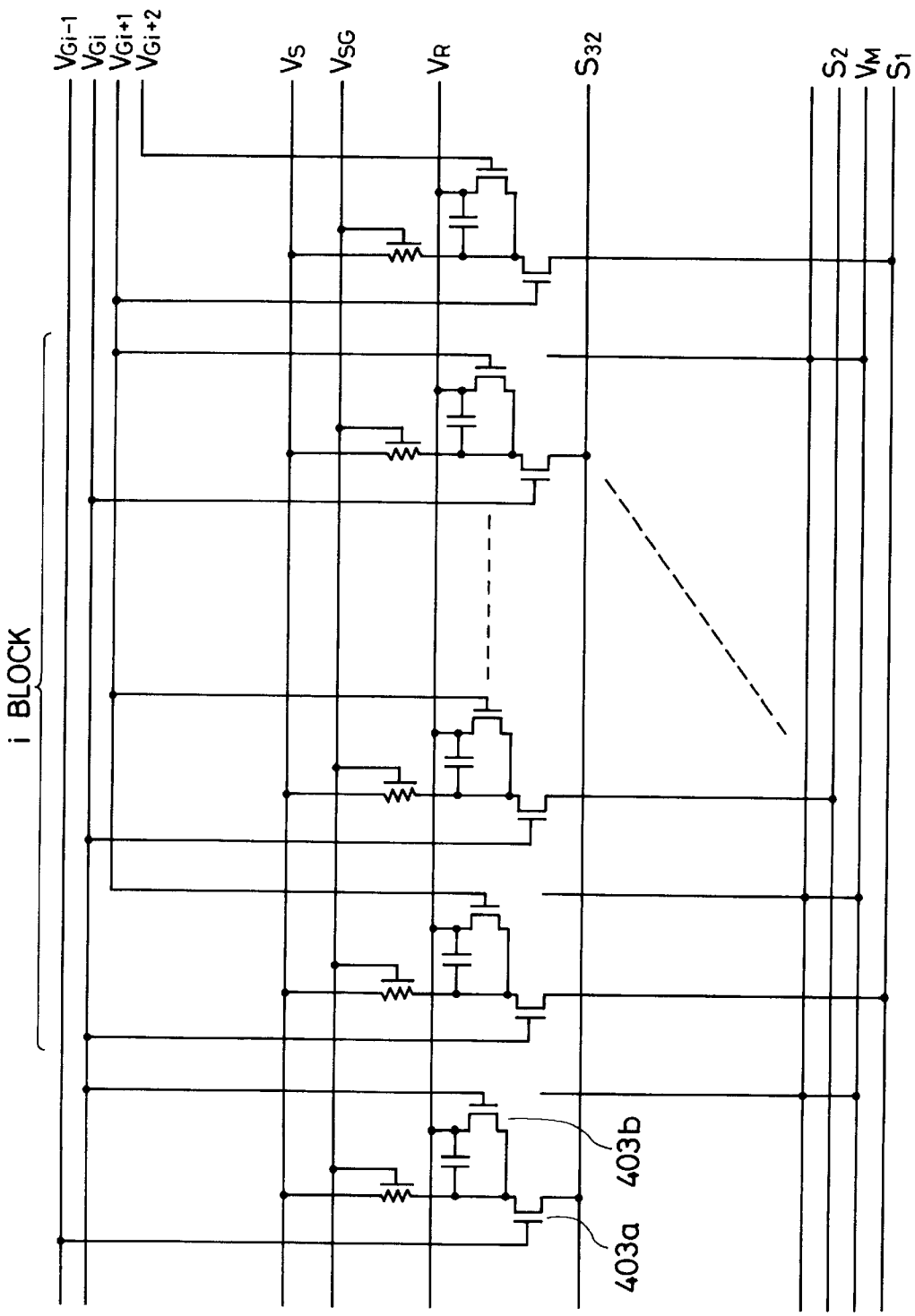
FIG. 19 is a circuit diagram of an image reading apparatus having a matrix wiring pattern.

FIG. 19 shows an equivalent circuit diagram of a portion having the ith block as a main region. The wiring lines between the second conductive layer of the matrix unit and the signal lines are kept at a potential $V_M$.

When the thickness of the SiN first insulating layer is 3,000 Å and the thickness of the semiconductor layer is about 5,000 Å, a gate voltage required for perfectly spreading the depletion layer in FIG. 18A is −1 V or less. Therefore, the voltage $V_M$ must always be higher by 1 V or more than the potential of the first conductive layer. This condition varies depending on various conditions such as sensor bias voltages and sensor capacitances.

According to this embodiment as described above, there is provided a photoelectric converter free from crosstalk between the output signals and having a compact wiring unit.

Figure 20:
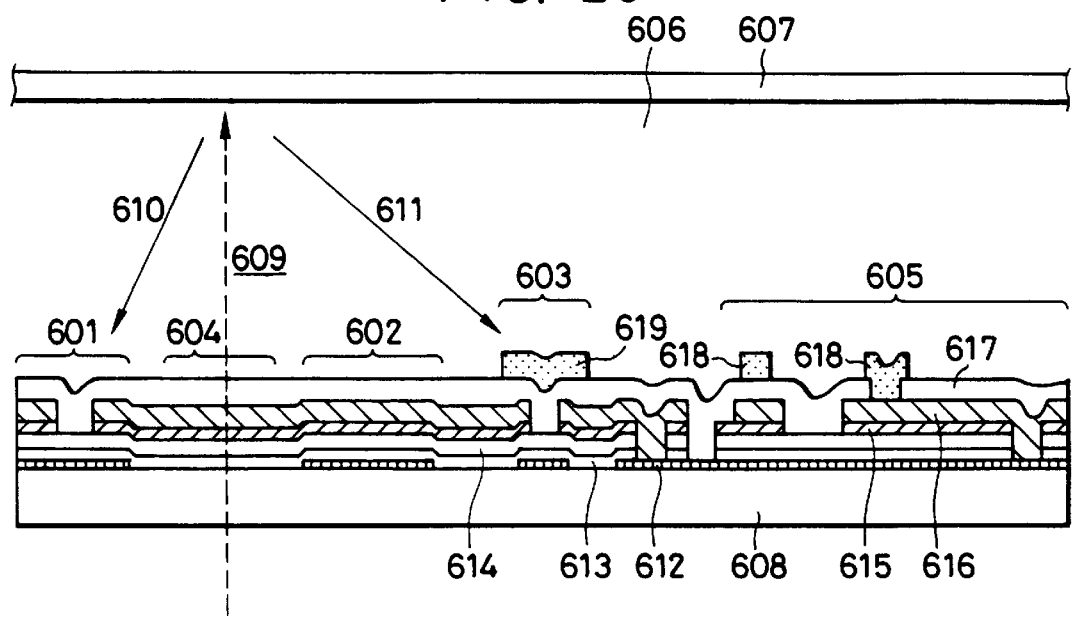
FIG. 20 is a sectional view showing the structure shown in FIG. 15.

FIG. 20 is a sectional view of a photoelectric converter according to still another embodiment of the present invention. This arrangement is substantially the same as that of FIG. 16 except for a light-shielding layer 619.

This structure can be manufactured in the same steps of FIGS. 17A to 17F. However, in the process of FIG. 17F, the third conductive layer 618 constitutes a necessary wiring pattern at the matrix unit but is left on the TFT so as to cover the channels.

The converter shown in FIG. 20 is prepared by the above steps. Referring to FIG. 20, incident light 609 from a light source traveling in a direction indicated by an arrow reaches an original 607 through a glass substrate 608, a window 604 through which light can pass, and a transparent spacer 606. The transparent spacer 606 protects a reading apparatus including the sensor and assures a predetermined distance between the original and the sensor.

Reflected light 610 from the original reaches a photoelectric conversion unit 1 and the optical signal is converted into an electrical signal according to image information. An unspecified light component 611 of light reflected by the original is reflected toward the TFT. The component 611 is not incident on the channel regions of the TFT due to the presence of a TFT light-shielding layer 603 formed of a third conductive layer 618.

Figure 21:
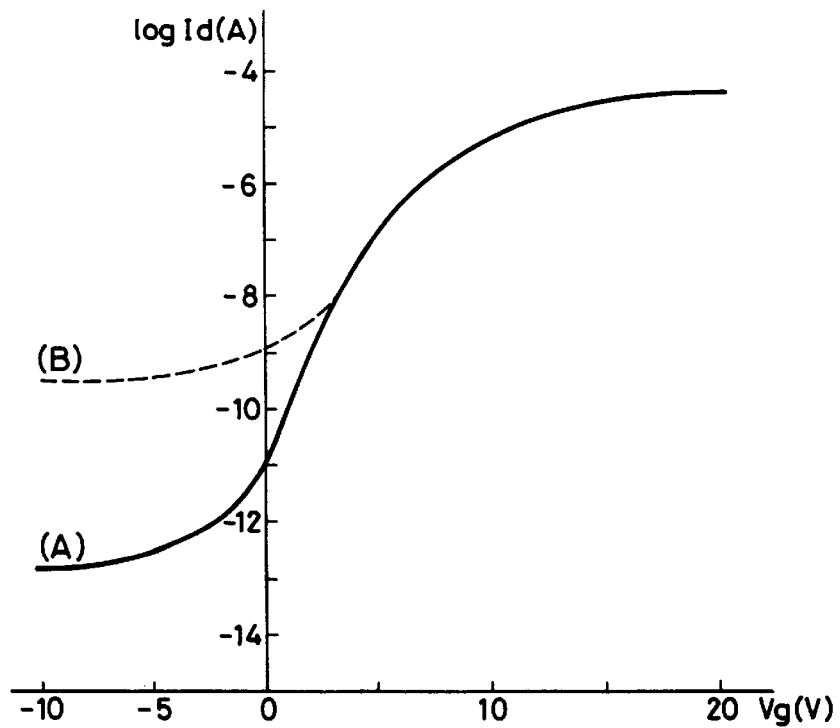
FIG. 21 is a graph showing Vg-Id characteristics of the TFT.

The Vg-Id characteristics of the TFT are shown in FIG. 21. A solid curve A in FIG. 21 represents the characteristics of the TFT in a dark state, while a dotted curve B represents the characteristics of the TFT when light is incident (10 1x) on the TFT. When light is incident in such a manner, i.e., when the TFT is held in the OFF state, or Vg≦0, a leakage current is increased. This leads to a decrease in S/N ratio of the TFT as a switching element and causes crosstalk through the TFT. Therefore, the S/N ratio of the photoelectric converter is decreased.

In the structure wherein the light-shielding layer 619 shown in FIG. 20 is formed on the channel regions of the TFT, the leakage current in the OFF state of the TFT is not increased. Therefore, the designed operation coinciding with the solid curve A in FIG. 21 can be obtained.

In order to obtain a more stable TFT operation, it is desirable to set the light-shielding layer 619 at a low potential. In the OFF state of the TFT, the light-shielding layer 619 serves as a floating gate and the TFT is not turned on. In practice, the light-shielding layer 619 is kept at the same potential as that of the TFT gate or the same potential as that of the TFT gate in the OFF state. However, the light-shielding layer 619 may be set at a potential lower than that of the TFT gate in the OFF state.

Figure 22A:
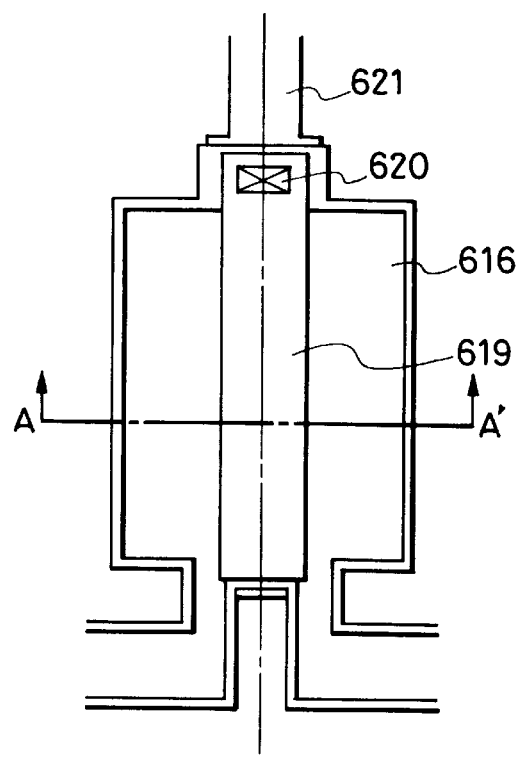
FIGS. 22A and 22B are plan views showing a TFT shown in FIG. 17.
Figure 22B:
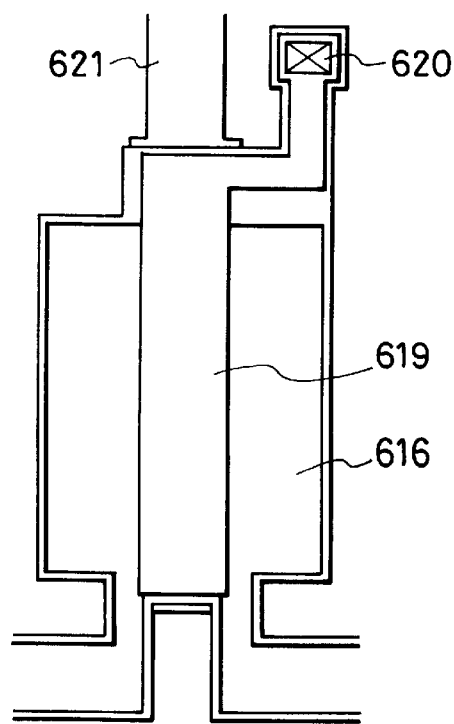

The plan views of the TFT units are shown in FIGS. 22A and 22B. FIG. 22A shows a case wherein a gate line 621 and a light-shielding layer 619 are kept at a common potential and are connected through a contact hole 620. FIG. 22B shows a case wherein the gate line 621 and the light-shielding layer 619 are kept at different potentials, and the light-shielding layer 619 is kept at a constant potential equal to or lower than that of the TFT gate in the OFF state. The same effect as described above can be obtained even if the potentials of the gate line and the light-shielding layer are changed between potentials lower than that of the gate TFT in synchronism with the ON/OFF operation of the TFT gate.

In this embodiment, as shown in FIG. 15, a signal transfer TFT 3a and a reset TFT 3b are described.

Figure 23:
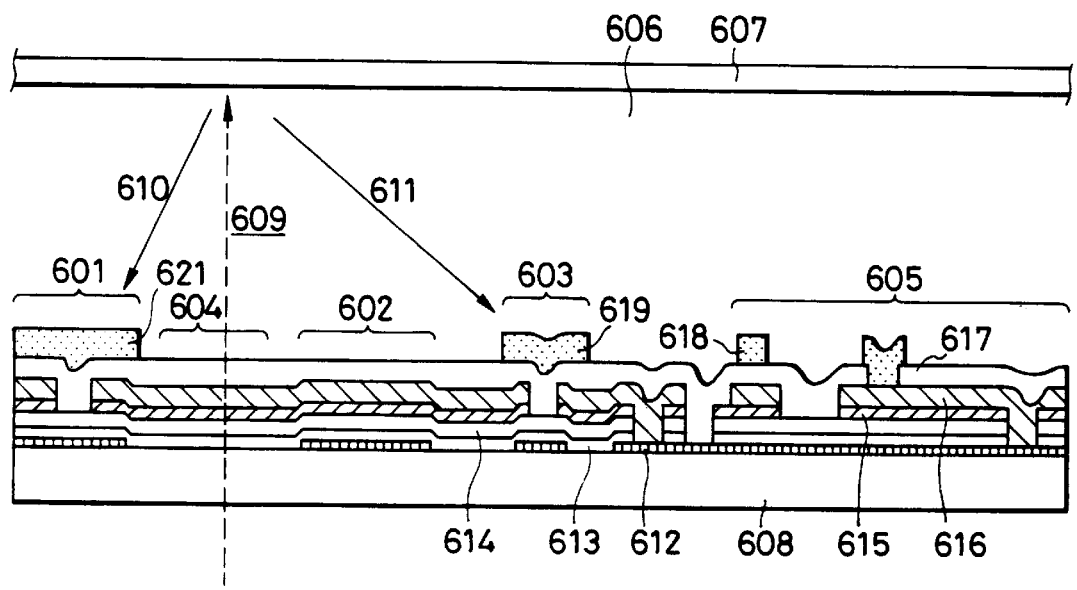
FIG. 23 is a sectional view showing a structure according to still another embodiment of the present invention.
Figure 24:
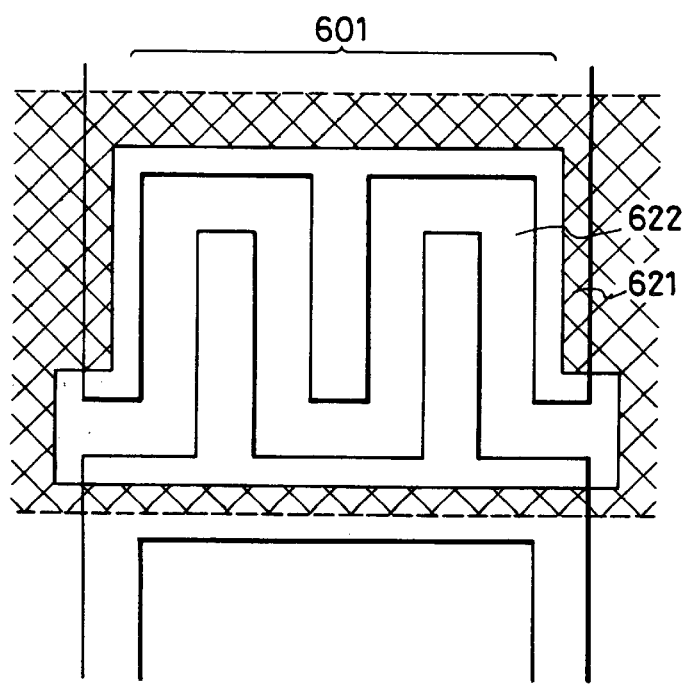
FIG. 24 is a plan view showing a sensor unit shown in FIG. 23.

In addition to the arrangement wherein the light-shielding layer is formed on the channel region, the third conductive layer may be used to stabilize the photoelectric conversion unit, and its embodiment is shown in the sectional view of FIG. 23. FIG. 24 is a plan view showing a region near a photoelectric conversion unit 601 of FIG. 23.

An electrostatic shielding layer 621 of a third conductive layer is formed in a portion except for a gap region 622 serving as a photoelectric conversion region of the photoelectric conversion unit 601. An electrostatic component is generated between an original and spacer (e.g., a thin glass plate) surface near the original side when an image reading apparatus reads an image from the original. This electrostatic component generates an electric field applied to the photoelectric conversion unit 601, and a stable photocurrent is not often obtained. The electrostatic shielding layer 621 is formed on the photoelectric conversion element and is kept at a predetermined potential, thereby obtaining a stable photocurrent. The potential of the electrostatic shielding layer 621 may be a ground potential or may be the same potential as one of the opposite electrodes of the photoelectric conversion unit 601.

When a light-shielding layer is formed on the surface of the photoelectric conversion unit 601 on the side of the glass substrate 608 so as to shield light from a light source, the potential of the electrostatic shielding layer can be set to be equal to that of the light-shielding layer of the photoelectric conversion unit 601.

In any case, the shielding layer for preventing the influence of the electrostatic component on the upper surface of the spacer which is in sliding contact with the original surface can be constituted as the third conductive layer.

Figure 25:
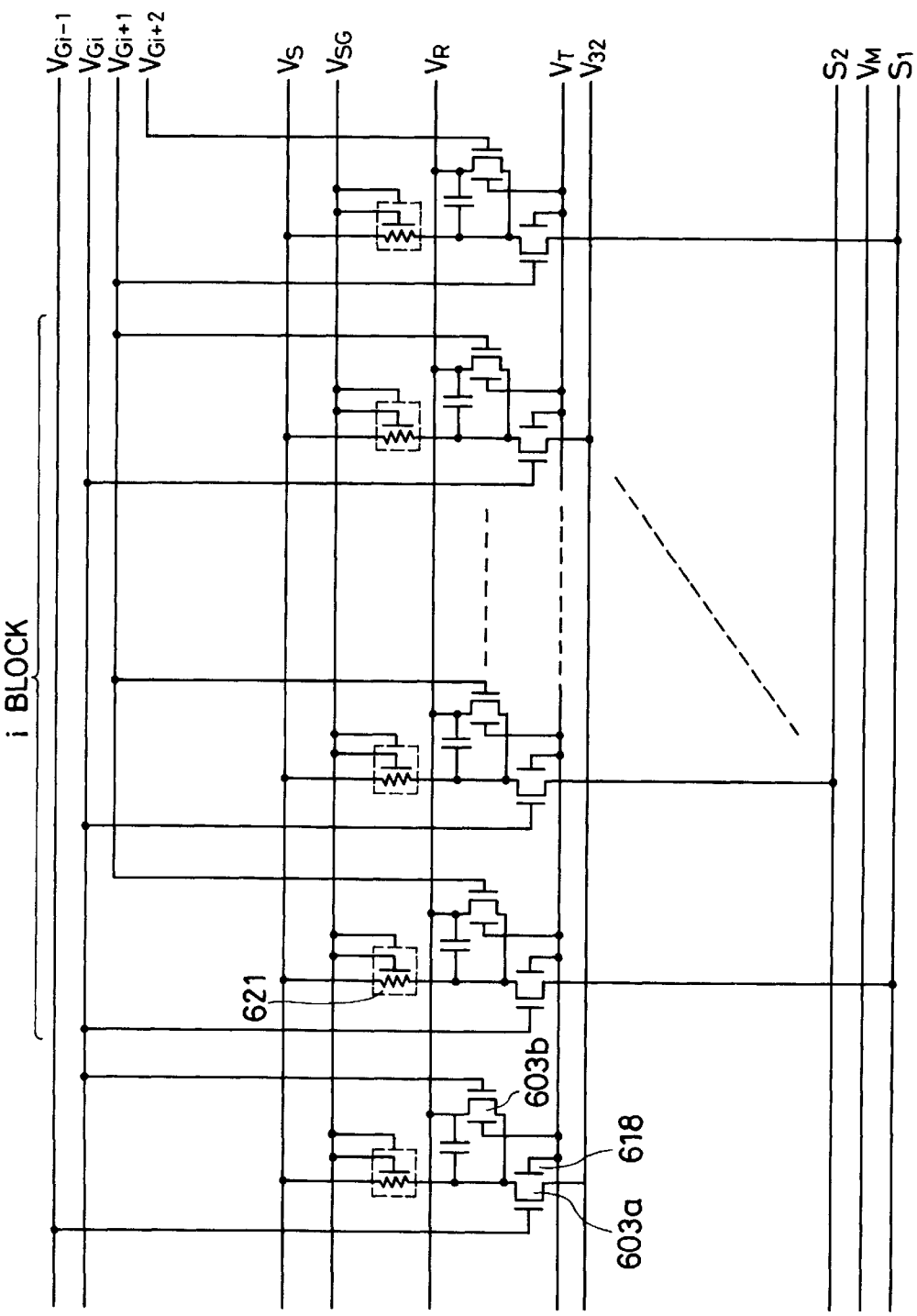
FIG. 25 is an equivalent circuit diagram of the sensor unit shown in FIG. 24.

FIG. 25 shows an equivalent circuit diagram wherein the light-shielding layer 618 of the TFT having an arrangement in FIG. 23 is set at a predetermined potential $V_T$ and the electrostatic shielding layer 621 of the sensor unit is set at the same potential as the predetermined potential $V_{SG}$. In this arrangement, a bias $V_S$ is applied to the sensor and a voltage $V_{SG}$ is applied to the sensor light-shielding layer. A reset potential is represented by $V_R$ and signal lines are represented by S1, S2, . . . S32. In this case, the second conductive layer of the matrix unit 605 is kept at a potential $V_M$. The light-shielding layer 618 of the TFT may be directly connected to the gate of the TFT. In this case, the TFT light-shielding layer 618 is driven by a gate potential $V_{Gi}$. The electrostatic shielding layer 621 of the sensor may be set at a predetermined potential independently of the voltage $V_{SG}$. The potential of the second conductive layer may be the ground potential and can be arbitrarily selected.

According to this embodiment as described above, the stray capacitances can be eliminated in the matrix unit, and light-shielding of the thin-film transistor can be performed, thereby reducing the leakage current and obtaining stable operation free from crosstalk.

In addition, the electrostatic shielding layer is formed on the surface of the sensor unit on the original side in the same step as in the process for forming other components, thereby improving stability of the photocurrent.

Moreover, the light-shielding layer of the thin-film transistor, the electrostatic shielding layer, and the third conductive layer of the matrix are constituted by the common conductive layer, thereby simplifying the fabrication process.

Figure 26:
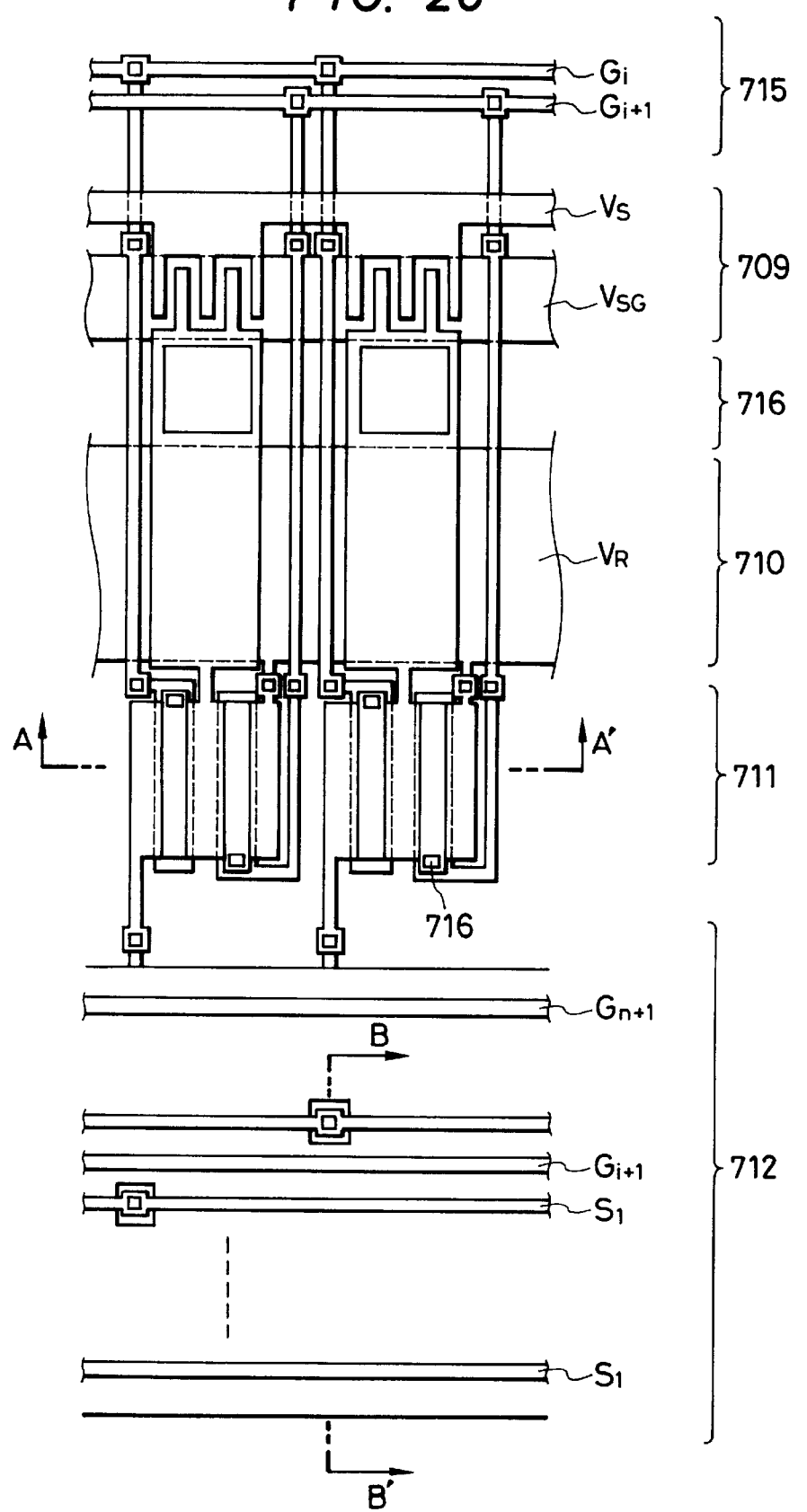
FIG. 26 is a plan view showing a photoelectric converter according to still another embodiment of the present invention.
Figure 27A:
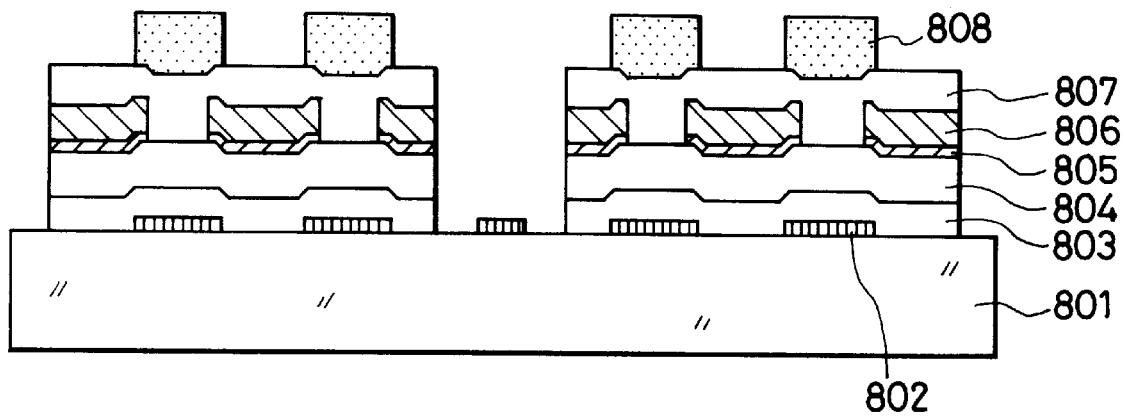
FIGS. 27A and 27B are sectional views of the photoelectric converter in FIG. 26 along the lines A-A' and B-B', respectively.
Figure 27B:
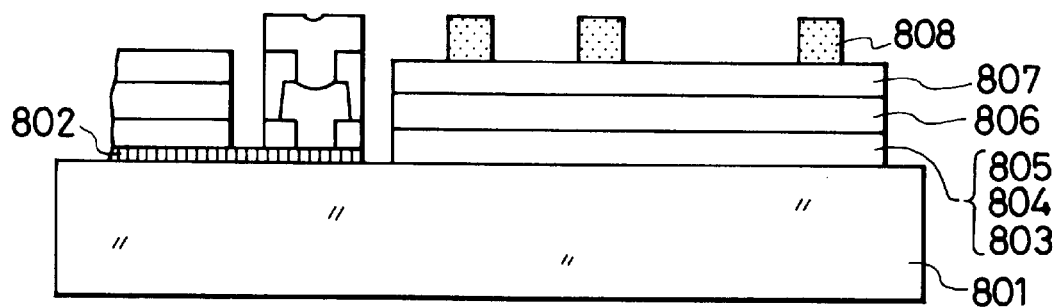
Figure 28:
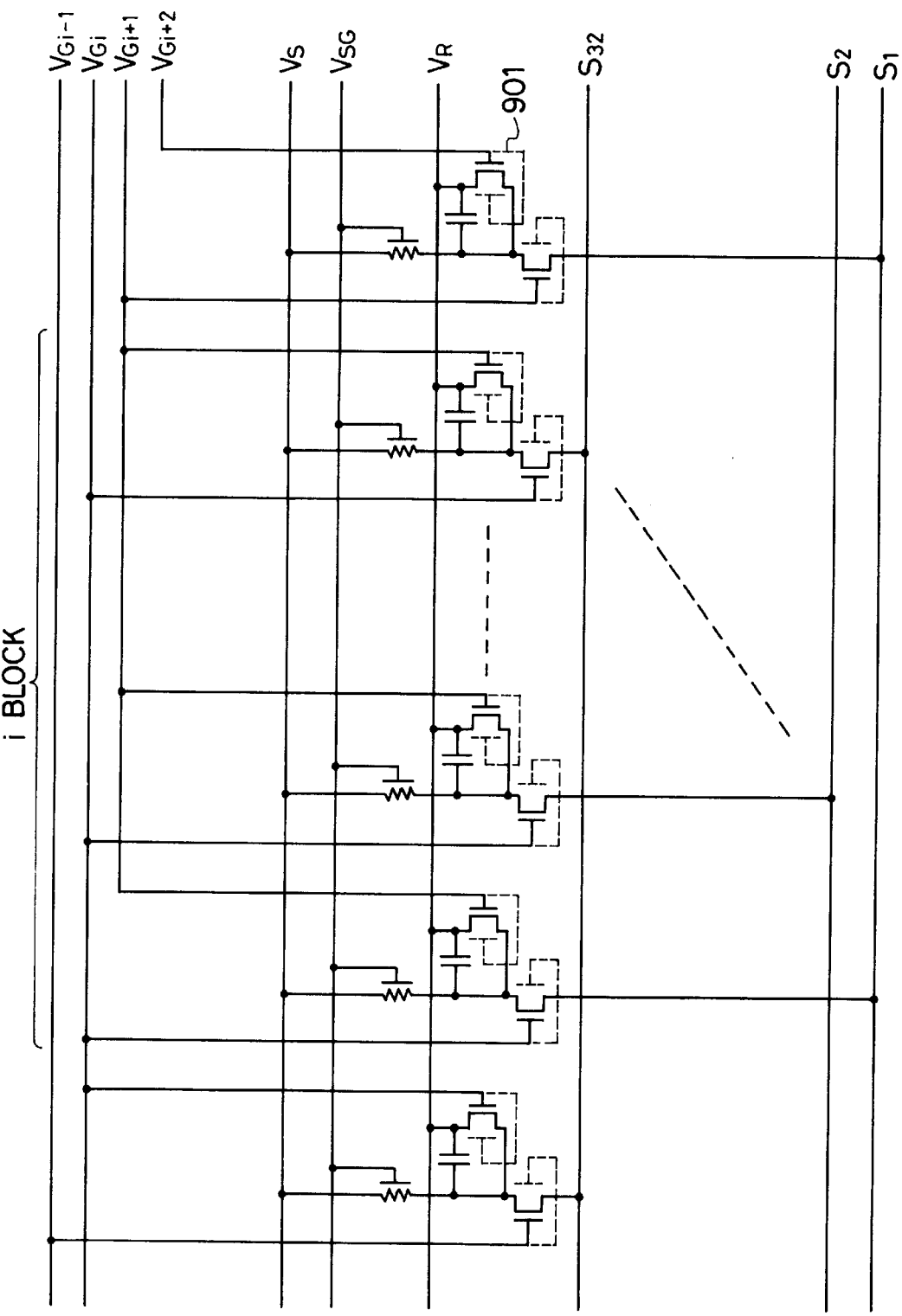
FIG. 28 is an equivalent circuit diagram of the photoelectric converter shown in FIG. 26.
Figure 29A:
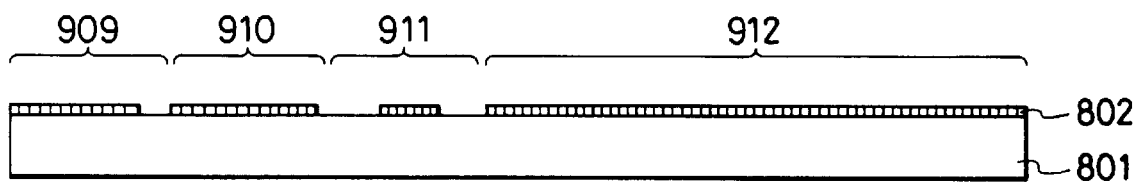
FIGS. 29A to 29F are sectional views for explaining the steps in manufacturing the photoelectric converter shown in FIG. 26.
Figure 29B:
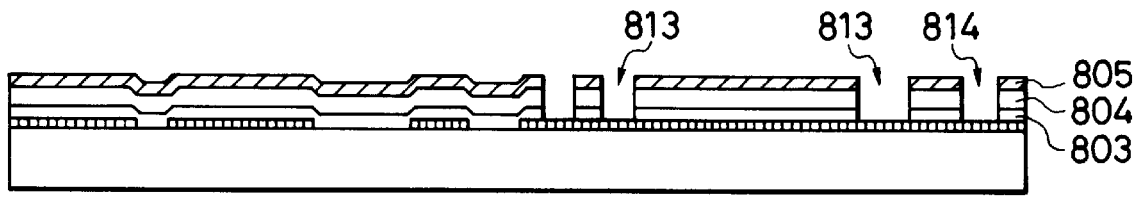
Figure 29C:
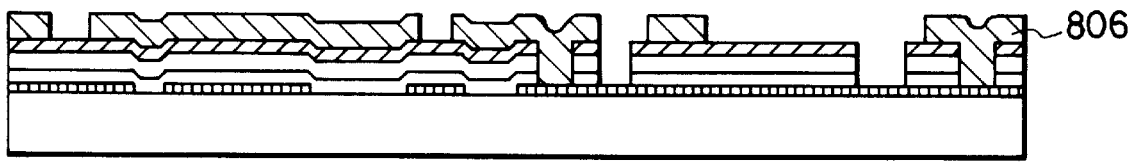
Figure 29D:
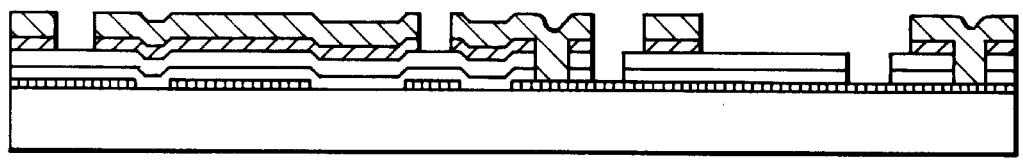
Figure 29E:
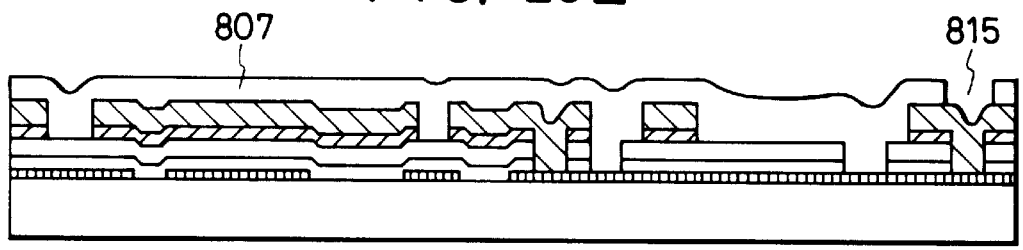
Figure 29F:
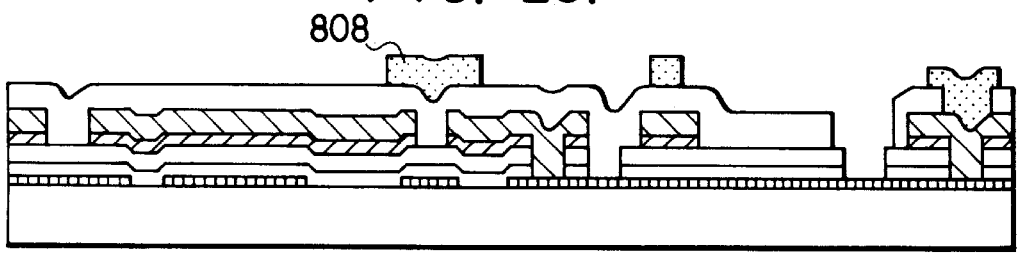

FIG. 26 is a plan view showing a photoelectric converter according to still another embodiment of the present invention, and FIGS. 27A and 27B are sectional views of the converter shown in FIG. 26 along the lines A-A' and B-B', respectively. FIG. 28 shows an equivalent circuit diagram of the converter shown in FIG. 26. FIGS. 29A to 29F are sectional views for explaining the steps in manufacturing the converter shown in FIG. 26.

Referring to FIG. 26, FIGS. 27A and 27B, FIG. 28, and FIGS. 29A to 29F, the converter includes a TFT drive gate matrix 715, a photoelectric conversion unit 709, a light incident window 716, capacitor 710 a TFT unit 711, and a signal matrix unit 712. The converter also includes ith block gate lines Gi, a photoelectric conversion element bias line Vs, a lower electrode $V_{SG}$ of the photoelectric conversion unit, a lower electrode $V_R$ of the capacitor, ground lines Gn of the common lines, common signal lines Si. A first conductive layer 802, an SiN layer 803, an a-Si:H layer 804, an n$^+$-type a-Si:H doping layer 805, a second conductive layer 806, a second insulating layer 807, and a third conductive layer 808 are sequentially formed on a glass substrate 801.

The structural and functional arrangements of the photoelectric converter are described above. A method of manufacturing this photoelectric converter will be described with reference to FIGS. 29A to 29F below.

A conductive film of Al, Cr, or the like is formed on a clean transparent substrate 801 of glass or the like by sputtering, deposition, or the like and is patterned into a desired shape to obtain the first conductive layer 802.

Using a known film formation technique such as plasma CVD, the SiN film 803 as the first insulating film, the a-Si:H film 804, and the n$^+$-type a-Si:H doping film 805 are continuously formed, and the third layer is patterned into a desired shape, thereby forming each element isolation region 813 so as to form a first contact hole 814.

A conductive film of Al, Cr, or the like is formed by sputtering, deposition, or the like and is patterned into a desired shape, thereby forming the second conductive film 806.

Unnecessary n$^+$-type a-Si:H doping layer portions such as a gap region of the photoelectric converter and the channel regions of the TFT are removed by etching.

An SiN or polyimide film as the second insulating film 807 is formed on the second conductive layer and is patterned to form a second contact hole 815 above the first contact hole.

A conductive film of Al, Cr, or the like is formed on the second insulating film by sputtering, deposition, or the like and is patterned into a desired shape, thereby forming the third conductive layer 808. In this case, a portion of the third conductive layer in the matrix unit serves as a necessary wiring pattern and another portion thereof is left to cover the channel regions above the TFT.

According to this embodiment as described above, the conductive layer is formed at the intersections between the separate output electrodes of the photoelectric conversion elements and the common lines so as to maintain the potential at a predetermined level, thereby decreasing the stray capacitances formed at the insulating intersections between the separate electrodes and the common lines. As a result, signal crosstalk caused by a capacitive component can be decreased, and an S/N ratio can be increased because a low-level signal can be processed.

Similarly, the wiring patterns are formed between the separate electrodes and between the common lines so as to maintain the potential at a predetermined level, so that capacitances between the electrodes and between the lines can be decreased. Therefore, signal crosstalk can be suppressed and an S/N ratio can be increased because a low-level signal can be processed. The uppermost metal layer of the wiring layers serves as the second gate of the TFT, so that the characteristics of the TFT can be improved. A special light-shielding means for the TFT need not be arranged. The TFT second gate can be formed simultaneously with other wiring patterns by using the same material as that of these patterns. Therefore, the fabrication process can be simplified at low cost.

We claim:

1. A photoelectric converter comprising:
a substrate bearing a layered structure comprising in order, a first conductive layer, a first insulating layer, a semiconductor layer, an ohmic contact layer, a second conductive layer, a second insulating layer, and a third conductive layer, said photoelectric converter comprising the following components formed from said layered structure:
a plurality of one-dimensionally arranged photoelectric conversion elements, each photoelectric conversion element including a lower electrode formed from said first conductive layer, said first insulating layer, said semiconductor layer, said ohmic contact layer having a first gap therein, a pair of upper electrodes formed from said second conductive layer and separated by said first gap, and said second insulating layer formed over said first gap;
a plurality of thin-film transistors (TFT), each TFT having a gate electrode formed from said first conductive layer, said first insulating layer, said semiconductor layer, said ohmic contact layer having a second gap therein, and a drain electrode and a source electrode formed from said second conductive layer and separated by said second gap, and said second insulating layer formed over said second gap;
a plurality of output lines formed from said first conductive layer;
a first plurality of through holes formed from said second conductive layer, wherein a respective one of said drain and source electrodes is connected to a respective one of said upper electrodes of said photoelectric conversion device, and the other of said drain and source electrodes is connected to a respective one of said output lines through a respective one of said first plurality of through holes;
a plurality of common lines formed from said third conductive layer, each common line connecting to at least two of said plurality of output lines respectively through a second plurality of through holes formed from said second and third conductive layers, said second conductive layer being further positioned between one of said common lines and one of said output lines at a respective intersection where said one common line overlaps said one output line and capable of being maintained at a first predetermined potential sufficiently high to substantially eliminate stray capacitance at said intersection.

2. A photoelectric converter according to claim 1, further comprising a plurality of capacitors, each capacitor including a lower plate formed from said first conductive layer, said first insulating layer, said semiconductor layer, said ohmic contact layer, and an upper plate formed from said second conductive layer and electrically connected to one of said upper electrodes of said photoelectric conversion element.

3. A photoelectric converter according to claim 1, further comprising a first wiring pattern respectively arranged between pairs of said output lines, said first wiring pattern formed from said first conductive layer, and a second wiring pattern respectively arranged between pairs of said common lines, said second wiring pattern formed from said third conductive layer, said first and second wiring patterns being connected to each other by a third plurality of through holes formed from said second conductive layer and capable of being maintained at a second predetermined potential sufficiently high to eliminate interline capacitance between said output lines, and interline capacitance between said common lines.

4. A photoelectric converter according to claim 1, wherein said TFTs have a channel region, and further comprising a light shield formed from said third conductive layer and positioned over a portion of said second insulating layer covering the channel region of at least one of said TFTs.

5. A photoelectric converter according to claim 1, further comprising an electrostatic shield formed from said third conductive layer and positioned over a portion of said second insulating layer, said electrostatic shield circumferentially covering said pair of upper electrodes of at least one of said photoelectric conversion elements.

6. A photoelectric converter according to claim 1, wherein said TFTs have a channel region, and have a second gate formed from said third conductive layer and positioned over a portion of said second insulating layer covering the channel region of said TFTs.

7. A photoelectric converter comprising:
a substrate bearing a layered structure comprising in order, a first conductive layer, a first insulating layer, a semiconductor layer, an ohmic contact layer, a second conductive layer, a second insulating layer, and a third conductive layer, said photoelectric converter comprising the following components formed from said layered structure:
a plurality of one-dimensionally arranged photoelectric conversion elements, each photoelectric conversion element including a lower electrode formed from said first conductive layer, said first insulating layer, said semiconductor layer, said ohmic contact layer having a first gap therein, a first upper electrode and a second upper electrode formed from said second conductive layer separated by said first gap, and said second insulating layer formed over said first gap;
a plurality of storage capacitors, each storage capacitor including a lower plate formed from said first conductive layer, said first insulating layer, said semiconductor layer, said ohmic contact layer, and an upper plate formed from said second conductive layer;
a plurality of readout capacitors, each readout capacitor including a lower plate formed from said first conductive layer, said first insulating layer, said semiconductor layer, said ohmic contact layer, and an upper plate formed from said second conductive layer;
a plurality of transfer thin-film transistors (transfer TFTs), each transfer TFT having a gate electrode formed from said first conductive layer, said first insulating layer, said semiconductor layer, said ohmic contact layer having a second gap therein, and a drain electrode and a source electrode formed from said second conductive layer and separated by said second gap, and said second insulating layer formed over said second gap;

a plurality of reset thin-film transistors (reset TFTs), each reset TFT having a gate electrode formed from said first conductive layer, said first insulating layer, said semiconductor layer, said ohmic contact layer having a second gap therein, and a drain electrode and a source electrode formed from said second conductive layer and separated by said second gap, and said second insulating layer formed over said second gap; and a plurality of signal lines formed from said third conductive layer and connected through a respective first plurality of through holes to respective ones of said source electrodes of said transfer TFTs and to respective ones of said lower plates of said readout capacitors, and wherein said plurality of signal lines overlie said plurality of storage capacitors, being electrically separated therefrom by said second insulating layer.

8. A photoelectric converter according to claim 7, further comprising a plurality of gate lines formed from said third conductive layer and connected via a second plurality of through holes to respective gate electrodes of said transfer TFTs and said reset TFTs, wherein said plurality of gate lines overlie said plurality of readout capacitors, being electrically separated therefrom by said second insulating layer.

9. A photoelectric converter according to claim 7, further comprising a sensor voltage line formed from said third conductive layer connected through a third plurality of through holes to said first upper electrodes of said photoelectric conversion elements, said second upper electrodes of said photoelectric conversion elements being respectively connected to (1) said lower electrodes of said photoelectric conversion elements, (2) said lower plates of said storage capacitors, (3) said drain electrodes of said reset TFTs and (4) said drain electrodes of said transfer TFTs.

10. A photoelectric converter according to claim 7, further comprising a reset voltage line formed from said third conductive layer, connected through a fourth plurality of through holes to the source electrodes of said reset TFTs.

11. A photoelectric converter according to claim 7, further comprising a first ground line formed from said second conductive layer and connected to said upper plates of said storage capacitors.

12. A photoelectric converter according to claim 7, further comprising a second ground line formed from said third conductive layer and connected via a fifth plurality of through holes to said upper plates of said readout capacitors.

13. A photoelectric converter according to any of claims 1 or 7, wherein said semiconductor layer comprises an amorphous silicon.

14. A photoelectric converter according to claim 13, wherein said amorphous silicon includes hydrogen.

15. A photoelectric converter according to any of claims 1 or 7, wherein said first insulating layer comprises a silicon nitride.

16. A photoelectric converter according to any of claims 1 or 7, wherein said ohmic contact layer comprises $n^+$ amorphous silicon.

17. A photoelectric converter according to claim 16, wherein said $n^+$ amorphous silicon includes hydrogen.

18. A photoelectric converter comprising:

a substrate bearing a layered structure comprising in order, a first conductive layer, a first insulating layer, a semiconductor layer, an ohmic contact layer, a second conductive layer, a second insulating layer, and a third conductive layer, said photoelectric converter comprising the following components formed from said layered structure:

a plurality of one-dimensionally arranged photoelectric conversion elements, each photoelectric conversion element including a lower electrode formed from said first conductive layer, said first insulating layer, said semiconductor layer, said ohmic contact layer having a first gap therein, a pair of upper electrodes formed from said second conductive layer and separated by said first gap, and said second insulating layer formed over said first gap;

a plurality of thin-film transistors (TFT), each TFT having a gate electrode formed from said first conductive layer, said first insulating layer, said semiconductor layer, said ohmic contact layer having a second gap therein, and a drain electrode and a source electrode formed from said second conductive layer and separated by said second gap, and said second insulating layer formed over said second gap;

a plurality of output lines formed from said first conductive layer;

a first plurality of through holes formed from said second conductive layer, wherein a respective one of said drain and source electrodes is connected to a respective one of said upper electrodes of said photoelectric conversion device, and the other of said drain and source electrodes is connected to a respective one of said output lines through a respective one of said first plurality of through holes;

a plurality of common lines formed from said third conductive layer, each common line connecting to at least two of said plurality of output lines respectively through a second plurality of through holes formed from said second and third conductive layers; and a first wiring pattern respectively arranged between pairs of said output lines, said first wiring pattern formed from said first conductive layer, and a second wiring pattern respectively arranged between pairs of said common lines, said second wiring pattern formed from said third conductive layer, said first and second wiring patterns being connected to each other by a third plurality of through holes formed from said second conductive layer and capable of being maintained at a predetermined potential sufficiently high to eliminate interline capacitance between said output lines, and interline capacitance between said common lines.

19. A photoelectric converter comprising:

a substrate bearing a layered structure comprising in order, a first conductive layer, a first insulating layer, a semiconductor layer, an ohmic contact layer, a second conductive layer, a second insulating layer, and a third conductive layer, said photoelectric converter comprising the following components formed from said layered structure:

a plurality of one-dimensionally arranged photoelectric conversion elements, each photoelectric conversion element including a lower electrode formed from said first conductive layer, said first insulating layer, said semiconductor layer, said ohmic contact layer having a first gap therein, a pair of upper electrodes formed from said second conductive layer and separated by said first gap, and said second insulating layer formed over said first gap;

a plurality of thin-film transistors (TFT), each TFT having a gate electrode formed from said first conductive layer, said first insulating layer, said semiconductor layer, said ohmic contact layer having a second gap therein, and a drain electrode and a source electrode formed from said second conductive layer and separated by said second gap, and said second insulating layer formed over said second gap, each of said TFTs having a channel region;

a first plurality of through holes formed from said second conductive layer, wherein a respective one of said drain and source electrodes is connected to a respective one of said upper electrodes of said photoelectric conversion device; and a light shield formed from said third conductive layer and positioned over a portion of said second insulating layer covering the channel region of at least one of said TFTs.

20. A photoelectric converter comprising:

a substrate bearing a layered structure comprising in order, a first conductive layer, a first insulating layer, a semiconductor layer, an ohmic contact layer, a second conductive layer, a second insulating layer, and a third conductive layer, said photoelectric converter comprising the following components formed from said layered structure:

a plurality of one-dimensionally arranged photoelectric conversion elements, each photoelectric conversion element including a lower electrode formed from said first conductive layer, said first insulating layer, said semiconductor layer, said ohmic contact layer having a first gap therein, a pair of upper electrodes formed from said second conductive layer and separated by said first gap, and said second insulating layer formed over said first gap; and an electrostatic shield formed from said third conductive layer and positioned over a portion of said second insulating layer, said electrostatic shield circumferentially covering said pair of upper electrodes of at least one of said photoelectric conversion elements.

21. A photoelectric converter comprising:

a substrate bearing a layered structure comprising in order, a first conductive layer, a first insulating layer, a semiconductor layer, an ohmic contact layer, a second conductive layer, a second insulating layer, and a third conductive layer, said photoelectric converter comprising the following components formed from said layered structure:

a plurality of one-dimensionally arranged photoelectric conversion elements, each photoelectric conversion element including a lower electrode formed from said first conductive layer, said first insulating layer, said semiconductor layer, said ohmic contact layer having a first gap therein, a pair of upper electrodes formed from said second conductive layer and separated by said first gap, and said second insulating layer formed over said first gap;

a plurality of thin-film transistors (TFT), each TFT having a gate electrode formed from said first conductive layer, said first insulating layer, said semiconductor layer, said ohmic contact layer having a second gap therein, and a drain electrode and a source electrode formed from said second conductive layer and separated by said second gap, and said second insulating layer formed over said second gap, each of said TFTs having a channel region and a second gate formed from said third conductive layer and positioned over a portion of said second insulating layer covering the channel region of said TFTs; and a first plurality of through holes formed from said second conductive layer, wherein a respective one of said drain and source electrodes is connected to a respective one of said upper electrodes of said photoelectric conversion device.

* * * * *

UNITED STATES PATENT AND TRADEMARK OFFICE
CERTIFICATE OF CORRECTION

PATENT NO. : 6,069,393
DATED : May 30, 2000
INVENTOR(S) : KATSUNORI HATANAKA ET AL.   Page 1 of 2

It is certified that error appears in the above-indentified patent and that said Letters Patent is hereby corrected as shown below:

ON THE TITLE PAGE:

[63] Related U.S. Application Data

"Continuation-in-part" should read --Continuation--; and

[56] References Cited, under *Attorney, Agent, or Firm-*

"Fitzpatrick Cella Harper &" should read --Fitzpatrick, Cella, Harper &--.

COLUMN 1:

Line 49, "$S_{sn.s}$" should read --$C_{sn.s}$--.

COLUMN 3:

Line 1, "a" should read --an--.

COLUMN 5:

Line 6, "separated" should read --separate--.

COLUMN 8:

Line 30, "side" should read --one side--.

UNITED STATES PATENT AND TRADEMARK OFFICE
CERTIFICATE OF CORRECTION

PATENT NO. : 6,069,393
DATED : May 30, 2000
INVENTOR(S) : KATSUNORI HATANAKA ET AL.

It is certified that error appears in the above-indentified patent and that said Letters Patent is hereby corrected as shown below:

COLUMN 13:

Line 50, "holes;" should read --holes; and--.

COLUMN 16:

Line 13, "cach" should read --each--.

Signed and Sealed this

Eighth Day of May, 2001

Attest:

NICHOLAS P. GODICI

Attesting Officer

Acting Director of the United States Patent and Trademark Office